United States Patent
Chen et al.

(10) Patent No.: US 12,089,445 B2
(45) Date of Patent: Sep. 10, 2024

(54) ARRAY SUBSTRATE HAVING VIA HOLE CONNECTING CONDUCTIVE PORTIONS, FABRICATION METHOD THEREOF AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Yipeng Chen, Beijing (CN); Ling Shi, Beijing (CN); Wenqiang Li, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 445 days.

(21) Appl. No.: 17/438,445

(22) PCT Filed: Oct. 27, 2020

(86) PCT No.: PCT/CN2020/124165
§ 371 (c)(1),
(2) Date: Sep. 12, 2021

(87) PCT Pub. No.: WO2022/087852
PCT Pub. Date: May 5, 2022

(65) Prior Publication Data
US 2022/0310732 A1    Sep. 29, 2022

(51) Int. Cl.
*H10K 59/121* (2023.01)
*H10K 59/131* (2023.01)
*H10K 59/12* (2023.01)

(52) U.S. Cl.
CPC ..... *H10K 59/1213* (2023.02); *H10K 59/1216* (2023.02); *H10K 59/131* (2023.02); *H10K 59/1201* (2023.02)

(58) Field of Classification Search
CPC ............. H10K 59/1213; H10K 59/131; H10K 59/1216
See application file for complete search history.

(56) References Cited

U.S. PATENT DOCUMENTS

| | | | | |
|---|---|---|---|---|
| 2020/0168691 A1* | 5/2020 | Choi | ..................... | H10K 50/858 |
| 2021/0028258 A1* | 1/2021 | Lee | ...................... | H10K 59/131 |
| 2021/0280666 A1* | 9/2021 | Sohn | ..................... | H01L 21/02 |

* cited by examiner

*Primary Examiner* — Michael Jung
(74) *Attorney, Agent, or Firm* — Perilla Knox & Hildebrandt LLP; Kenneth A. Knox

(57) ABSTRACT

This disclosure provides an array substrate, a fabrication method thereof, and a display device. The array substrate includes a P-type driving transistor, an N-type first transistor, a capacitor, a base substrate, a first conductive layer laminated at a side of the base substrate, a first dielectric layer laminated at a side of the first conductive layer away from the base substrate, a first buffer layer laminated at a side of the first dielectric layer facing away from the base substrate and having a slot, and a second conductive layer laminated at a side of the first buffer layer facing away from the base substrate. The second conductive layer includes a second conductive portion configured as the gate electrode of the first transistor, and a third conductive portion located at the bottom of the slot to form the second electrode of the capacitor.

19 Claims, 14 Drawing Sheets

025), 
ARRAY SUBSTRATE HAVING VIA HOLE CONNECTING CONDUCTIVE PORTIONS, FABRICATION METHOD THEREOF AND DISPLAY DEVICE

CROSS-REFERENCE TO RELATED APPLICATION

The present application is a national phase application under 35 U.S.C. § 371 of International Application No. PCT/CN2020/124165 filed Oct. 27, 2020, the contents of which being incorporated by reference in their entireties herein.

TECHNICAL FIELD

The present disclosure relates to a display technical field and, in particular, to an array substrate, a fabrication method thereof, and a display device.

BACKGROUND

In the related art, a pixel driving circuit may be formed using the low temperature polycrystalline oxide (LTPO) technology, and the LTPO technology forms the pixel driving circuit by combining an N-type metal oxide transistor and a P-type low temperature polysilicon transistor.

In the related art, a LTPO technology usually forms an electrode of a capacitor in a pixel driving circuit through a conductive portion located in a source-drain layer. The conductive portion is connected with a gate electrode of the driving transistor through a via hole, for realizing connection between the capacitor and the gate electrode of the driving transistor. However, in order to form a capacitor structure, the conductive portion has a larger area, so that the gate electrode of the driving transistor connected with the conductive portion is easily affected by noise.

It should be noted that information disclosed in this part are provided only for acquiring a better understanding of the background of the present application and therefore may include information that is not current technology already known to those of ordinary skill in the art.

SUMMARY

According to one aspect of the present disclosure, an array substrate is provided. The array substrate includes a pixel driving circuit including a P-type driving transistor, an N-type first transistor and a capacitor. A first electrode of the first transistor is connected to a gate electrode of the driving transistor, and a first electrode of the capacitor is connected to the gate electrode of the driving transistor. The array substrate further includes a base substrate, a first conductive layer, a first dielectric layer, a first buffer layer, and a second conductive layer. The first conductive layer is laminated at a side of the base substrate and includes a first conductive portion that is configured as the gate electrode of the driving transistor and the first electrode of the capacitor. The first dielectric layer is laminated at a side of the first conductive layer facing away from the base substrate. The first buffer layer is laminated at a side of the first dielectric layer facing away from the base substrate. A slot is provided on the first buffer layer, and an orthographic projection of the slot on the base substrate is at least partially overlapped with an orthographic projection of the first conductive portion on the base substrate. The second conductive layer is laminated at a side of the first buffer layer facing away from the base substrate.

The second conductive layer includes a second conductive portion and a third conductive portion. The second conductive portion is configured as a gate electrode of the first transistor. The third conductive portion is at least partially located at a bottom portion of the slot, and an orthographic projection of the third conductive portion on the base substrate is at least partially overlapped with the orthographic projection of the first conductive portion on the base substrate, so as to form a second electrode of the capacitor.

In an exemplary embodiment of the present disclosure, the slot extends to a surface of the first dielectric layer, and the third conductive portion is at a side of the first dielectric layer facing away from the base substrate.

In an exemplary embodiment of the present disclosure, the array substrate further includes a third conductive layer. The third conductive layer is laminated at a side of the second conductive layer facing away from the base substrate, and includes a fourth conductive portion. The fourth conductive portion is electrically connected with the first conductive portion through a first via hole penetrating through the third conductive portion, and is insulated from the second conductive portion. An orthographic projection of the fourth conductive portion on the base substrate is on the orthographic projection of the first conductive portion on the base substrate, and an area of the orthographic projection of the fourth conductive portion on the base substrate is smaller than that of the orthographic projection of the first conductive portion on the base substrate.

In an exemplary embodiment of the present disclosure, a ratio of the area of the orthographic projection of the fourth conductive portion on the base substrate to an area of an orthographic projection of the first via hole on the base substrate is 1-1.5.

In an exemplary embodiment of the present disclosure, a ratio of the area of the orthographic projection of the fourth conductive portion on the base substrate to an area of the orthographic projection of the first conductive portion on the base substrate is 8%-15%.

In an exemplary embodiment of the present disclosure, a second via hole is formed on the third conductive portion and extends through the first dielectric layer to a surface of the first conductive portion. The array substrate further includes a second dielectric layer laminated between the second conductive layer and the third conductive layer. The first via hole is formed on the second dielectric layer and extends through the third conductive portion to the surface of the first conductive portion. An orthographic projection of the first via hole on the base substrate is within an orthographic projection of the second via hole on the base substrate.

In an exemplary embodiment of the present disclosure, the third conductive layer further includes a power line for providing a power supply voltage The array substrate further includes a fourth conductive layer. The fourth conductive layer is laminated at a side of the third conductive layer facing away from the base substrate, and includes a fifth conductive portion connected with the power line. An orthographic projection of the fifth conductive portion on the base substrate covers the orthographic projection of the first conductive portion on the base substrate.

In an exemplary embodiment of the present disclosure, the second conductive layer further includes a sixth conductive portion connected with the third conductive portion, and the sixth conductive portion is connected with the power line through a via hole.

In an exemplary embodiment of the present disclosure, the first buffer layer includes the first buffer layer and a first gate insulating layer. The first buffer layer is laminated at a side of the first dielectric layer facing away from the base substrate, and the first gate insulating layer is laminated at a side of the first buffer layer facing away from the base substrate.

In an exemplary embodiment of the present disclosure, the array substrate further includes a first active layer, a second active layer, a second gate insulating layer, a barrier layer, a second buffer layer, a second dielectric layer, a passivation layer and a first gate insulating layer. The barrier layer is laminated at a side of the base substrate. The second buffer layer is laminated at a side of the barrier layer facing away from the base substrate. The first active layer is laminated at a side of the second buffer layer facing away from the base substrate, and includes a first active portion configured as a channel region of the driving transistor. The second gate insulating layer is laminated at a side of the first active layer facing away from the base substrate, and the first conductive layer is laminated at a side of the second gate insulating layer facing away from the base substrate. The second active layer is laminated at a side of the first buffer layer facing away from the base substrate and includes a second active portion configured as a channel region of the first transistor. The first gate insulating layer is laminated at a side of the second active layer facing away from the base substrate, and the second conductive layer is laminated at a side of the first gate insulating layer facing away from the base substrate. The second dielectric layer is laminated at a side of the second active layer facing away from the base substrate. The second dielectric layer is laminated at a side of the second conductive layer facing away from the base substrate. The third conductive layer is laminated at a side of the second dielectric layer facing away from the base substrate. The passivation layer is laminated at a side of the third conductive layer facing away from the base substrate.

In an exemplary embodiment of the present disclosure, the array substrate includes a non-display area. A strip-shaped groove is formed in the non-display area on the array substrate, and extends through the passivation layer, the second dielectric layer, the first buffer layer, the first dielectric layer, the second buffer layer and the barrier layer to a surface of the base substrate. The array substrate further includes a first flat layer laminated at a side of the passivation layer facing away from the base substrate and filling the strip-shaped groove. A bendable performance of a material of the first flat layer is stronger than that of a material of any of the passivation layer, the second dielectric layer, the first buffer layer, the first dielectric layer, the second buffer layer and the barrier layer.

In an exemplary embodiment of the present disclosure, a thickness of the first dielectric layer in a laminated direction is 1,200-1,400 angstroms.

In an exemplary embodiment of the present disclosure, the array substrate further includes an enable signal line, an initial signal line, an anode layer, a first reset signal line, a second reset signal line, a power line, a first gate line, a second gate line and a data line. The first transistor has a second electrode connected to a second electrode of the driving transistor, and a gate electrode is connected to the second gate line. The pixel driving circuit further includes a second transistor, a third transistor, a fourth transistor, a fifth transistor, and a sixth transistor. The second transistor has a first electrode connected to the data line, a second electrode connected to the first electrode of the driving transistor, and a gate electrode connected to the first gate line. The third transistor has a first electrode connected to the gate electrode of the driving transistor, a second electrode connected to the initial signal line, and a gate electrode connected to the second reset signal line. The fourth transistor has a first electrode connected to the power line, a second electrode connected to the first electrode of the driving transistor, and a gate electrode connected to the enable signal line. The fifth transistor has a first electrode connected to the second electrode of the driving transistor, a second electrode connected to the anode layer, and a gate electrode connected to the enable signal line. The sixth transistor has a first electrode connected to the second electrode of the fifth transistor, a second electrode connected to the initial signal line, and a gate electrode connected to the first reset signal line.

In an exemplary embodiment of the present disclosure, the driving transistor, the second transistor, the fourth transistor, the fifth transistor and the sixth transistor are P-type low-temperature polysilicon transistors. The first transistor and the third transistor are N-type metal oxide transistors.

According to one aspect of the present disclosure, a fabrication method of an array substrate is provided. The array substrate includes a pixel driving circuit including a P-type driving transistor, an N-type first transistor and a capacitor. A first electrode of the first transistor is connected with a gate electrode of the driving transistor, and a first electrode of the capacitor is connected with the gate electrode of the driving transistor. The fabrication method of the array substrate includes steps of:
  forming a base substrate;
  forming a first conductive layer at a side of the base substrate, the first conductive layer including a first conductive portion, and the first conductive portion being configured as the gate electrode of the driving transistor and the first electrode of the capacitor;
  forming a first dielectric layer at a side of the first conductive layer facing away from the base substrate;
  forming a first buffer layer at a side of the first dielectric layer facing away from the base substrate, a slot being provided on the first buffer layer, an orthographic projection of the slot on the base substrate being at least partially overlapped with an orthographic projection of the first conductive portion on the base substrate;
  forming a second conductive layer at a side of the first buffer layer facing away from the first conductive layer. The second conductive layer includes:
  a second conductive portion configured as a gate electrode of the first transistor;
  a third conductive portion at a bottom portion of the slot, an orthographic projection of the third conductive portion on the base substrate being at least partially overlapped with the orthographic projection of the first conductive portion on the base substrate so as to form a second electrode of the capacitor.

In an exemplary embodiment of the present disclosure, the step of forming a first buffer layer at a side of the first dielectric layer facing away from the first conductive layer includes steps of:
  forming a first buffer material layer at a side of the first dielectric layer facing away from the base substrate;
  forming a first gate insulating material layer at a side of the first buffer material layer facing away from the base substrate;
  etching the first buffer material layer and the first gate insulating material layer to form the slot;
  wherein the etched first buffer material layer forms the first buffer layer.

In an exemplary embodiment of the present disclosure, the slot extends to a surface of the first dielectric layer, and the third conductive portion is at a side of the first dielectric layer facing away from the base substrate.

In an exemplary embodiment of the present disclosure, the fabrication method of the array substrate further includes a step of:
forming a third conductive layer at a side of the second conductive layer facing away from the base substrate, the third conductive layer including a fourth conductive portion electrically connected with the first conductive portion through a via hole penetrating through the third conductive portion;
wherein an orthographic projection of the fourth conductive portion on the base substrate is on the orthographic projection of the first conductive portion on the base substrate, and an area of the orthographic projection of the fourth conductive portion on the base substrate is smaller than that of the orthographic projection of the first conductive portion on the base substrate.

In an exemplary embodiment of the present disclosure, before the step of forming a third conductive layer at a side of the second conductive layer facing away from the base substrate, the fabrication method further includes steps of:
forming a second via hole on the third conductive portion, wherein the second via hole extends through the first dielectric layer to a surface of the first conductive portion;
forming a second dielectric layer at a side of the second conductive layer facing away from the base substrate, the second dielectric layer filling the second via hole;
forming a first via hole on the second dielectric layer, wherein the first via hole extending through the third conductive portion to the surface of the first conductive portion, and an orthographic projection of the first via hole on the base substrate being within an orthographic projection of the second via hole on the base substrate;
wherein the fourth conductive portion fills the first via hole.

According to one aspect of the present disclosure, a display device is provided. The display device includes the array substrate described above.

It should be understood that both the foregoing general description and the following detailed description are exemplary and explanatory only and are not restrictive of the disclosure.

BRIEF DESCRIPTION OF THE DRAWINGS

The accompanying drawings, which are incorporated in and constitute part of this specification, illustrate embodiments consistent with the invention and, together with the description, serve to explain the principles of the invention. Apparently, the drawings in the following description are only for illustrating some embodiments of the present disclosure and those of ordinary skill in the art can also derive other drawings based on the drawings without paying any creative labor.

DETAILED DESCRIPTION

Figure 1:
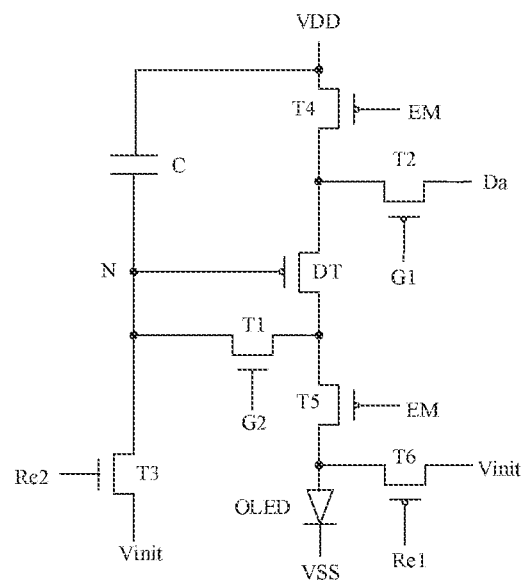
FIG. 1 is a schematic circuit structural diagram of a pixel driving circuit of the present disclosure.

Now, the exemplary embodiments will be described more fully with reference to the accompanying drawings. However, the exemplary embodiments can be embodied in a variety of forms and should not be construed as limiting the embodiments set forth herein. Instead, these embodiments are provided so that the present disclosure will be thorough and complete, and the concepts of the exemplary embodiments will be fully given to those skilled in the art. Same reference numbers denote the same or similar structures in the figures, and thus the detailed description thereof will be omitted.

Although terms having opposite meanings such as "up" and "down" are used herein to describe the relationship of one component relative to another component, such terms are used herein only for the sake of convenience, for example, "in the direction illustrated in the figure". It can be understood that if a device denoted in the drawings is turned upside down, a component described as "above" something will become a component described as "under" something. Other relative terms, such as "high", "low", "top", "bottom", "left" and "right" have similar meanings. When a structure is described as "above" another structure, it probably means that the structure is integrally formed on another structure, or, the structure is "directly" disposed on another structure, or, the structure is "indirectly" disposed on another structure through an additional structure.

Words such as "one", "an/a", "the" and "said" are used herein to indicate the presence of one or more elements/component parts/and others. Terms "including", and "having" have an inclusive meaning which means that there may be additional elements/component parts/and others in addition to the listed elements/component parts/and others.

FIG. 1 is a schematic circuit structure diagram of a pixel driving circuit of the present disclosure. The pixel driving circuit may include a driving transistor DT, a second transistor T2, a first transistor T1, a third transistor T3, a fourth transistor T4, a fifth transistor T5, a sixth transistor T6 and a capacitor C. The second transistor T2 has a first electrode connected to a data signal terminal Da, a second electrode connected to the first electrode of the driving transistor DT, and a gate electrode connected to a first gate driving signal terminal G1. The fourth transistor T4 has a first electrode connected to a first power terminal VDD, a second electrode connected to the first electrode of the driving transistor DT, and a gate electrode connected to an enable signal terminal EM. The driving transistor DT has a gate electrode connected to a node N, and a second electrode connected to a first electrode of the fifth transistor T5. The first transistor T1 has a first electrode connected to the node N, a second electrode connected to the second electrode of the driving transistor DT, and a gate electrode connected to a second gate driving signal terminal G2. The fifth transistor T5 has a second electrode connected to a first electrode of the sixth transistor T6, and a gate electrode connected to the enable signal terminal EM. The sixth transistor T6 has a second electrode connected to an initial signal terminal Vinit, and a gate electrode connected to a first reset signal terminal Re1. The third transistor T3 has a first electrode connected to the node N, a second electrode connected to the initial signal terminal Vinit, and a gate electrode connected to a second reset signal terminal Re2. The capacitor C is connected between the first power terminal VDD and the node N. The pixel driving circuit may be connected with a light emitting unit OLED for driving the light emitting unit OLED to emit light, and the light emitting unit OLED is connected between the second electrode of the fifth transistor T5 and the second power terminal VSS. The first transistor T1 and the third transistor T3 may be N-type metal oxide transistors having smaller leakage current, so as to avoid electric leakage of the node N through the first transistor T1 and the third transistor T3 during a light emitting stage. Meanwhile, the driving transistor DT, the second transistor T2, the fourth transistor T4, the fifth transistor T5, and the sixth transistor T6 may be low temperature polysilicon transistors having higher carrier mobility, thereby facilitating to realize a display device with high resolution, high reaction speed, high pixel density, and high aperture ratio.

Figure 2:
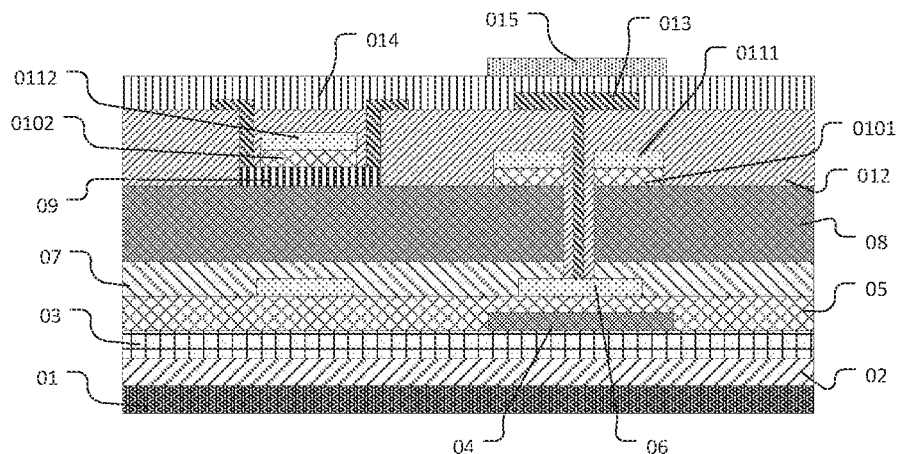
FIG. 2 is a schematic structural diagram of an array substrate in the related art.

FIG. 2 is a structural schematic diagram of an array substrate in the related art. The array substrate may include the pixel driving circuit shown in FIG. 1. The array substrate may include a base substrate 01, a barrier layer 02 at a side of the base substrate 01, a second buffer layer 03 at a side of the barrier layer facing away from the base substrate 01, a first active layer (including a first active portion 04) at a side of the second buffer layer 03 facing away from the base substrate 01, a first gate insulating layer 05 at a side of the first active layer facing away from the base substrate, a first gate layer (including a first gate portion 06) at a side of the first gate insulating layer facing away from the base substrate, a first dielectric layer 07 at a side of the first gate layer facing away from the base substrate, a first buffer layer 08 at a side of the first dielectric layer 07 facing away from the base substrate 01, a second active layer (including a second active portion 09) at a side of the first buffer layer 08 facing away from the base substrate 01, a second gate insulating layer (including a first insulating portion 0101 and a second insulating portion 0102) at a side of the second active layer facing away from the base substrate, a second gate layer (including a second gate portion 0112 and a third gate portion 0111) at a side of the second gate insulating layer facing away from the base substrate, a second dielectric layer 012 at a side of the second gate layer facing away from the base substrate, a first source-drain layer (including a first conductive portion 013) at a side of the second dielectric layer 012 facing away from the base substrate, a passivation layer 014 at a side of the first source-drain layer facing away from the base substrate, and a second source-drain layer (including a second conductive portion 015) at a side of the passivation layer 014 facing away from the base substrate. The first gate portion 06 may be configured as a gate electrode of the driving transistor, and the second gate portion 0112 may be configured as a gate electrode of the first transistor T1 or the third transistor T3. The first conductive portion 013 is connected with the first gate portion 06 through a via hole. In the related art, a distance between the first source-drain layer and the second source-drain layer is small, so that the second conductive portion 015 may form a second electrode of the capacitor C, meanwhile, the second conductive portion 015 may cover the first conductive portion 013 to shield the influence on the first conductive portion 013 due to the noise of other signals. However, since the first conductive portion 013 needs to form an electrode of a capacitor, the first conductive portion 013 is required to have a larger area, so that it is difficult for the second conductive portion 015 to completely cover the first conductive portion 013 in a limited plane space, thus causing the first conductive portion 013 to be easily interfered by external noise. In addition, the first conductive portion 013 having a larger area is easy to form larger parasitic capacitances with other structures, and a gate electrode of the driving transistor is more susceptible to external noise interference under the parasitic capacitance coupling effect.

Figure 3:
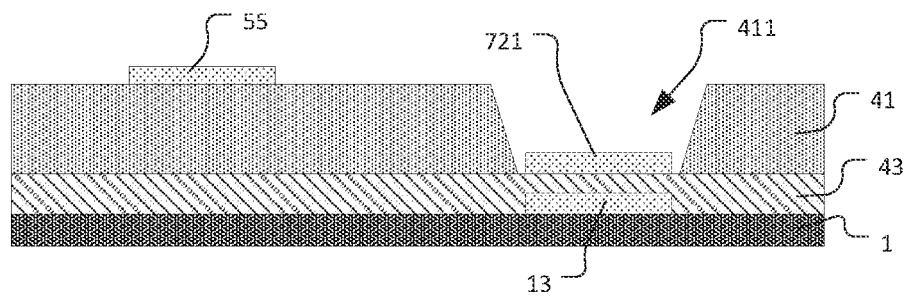
FIG. 3 is a structural schematic diagram of an array substrate of an exemplary embodiment of the present disclosure.

Based on this, this exemplary embodiment provides an array substrate including a pixel driving circuit, which may be as shown in FIG. 1. As shown in FIG. 3, it is a structural schematic diagram of an array substrate of an exemplary embodiment of the present disclosure. The array substrate may include a base substrate 1, a first conductive layer, a first dielectric layer 43, a first buffer layer 41 and a second conductive layer. The first conductive layer is laminated at a side of the base substrate 1. The first conductive layer may include a first conductive portion 13, and the first conductive portion 13 may be configured as a gate electrode of the driving transistor and a first electrode of the capacitor C. The first dielectric layer 43 may be laminated at a side of the first conductive layer facing away from the base substrate 1. The first buffer layer 41 may be laminated at a side of the first dielectric layer 43 facing away from the base substrate 1. The first buffer layer 41 is provided with a slot 411, and an orthographic projection of the slot 411 on the base substrate is at least partially overlapped with an orthographic projection of the first conductive portion 13 on the base substrate.

The second conductive layer is laminated at a side of the first buffer layer 41 facing away from the base substrate 1. The second conductive layer may include a second conductive portion 55 and a third conductive portion 721. The second conductive portion 55 is configured as a gate electrode of the first transistor, the third conductive portion 721 is located at a bottom portion of the slot 411, and an orthographic projection of the third conductive portion 721 on the base substrate 1 is at least partially overlapped with an orthographic projection of the first conductive portion 13 on the base substrate, so as to form a second electrode of the capacitor. The second conductive portion 55 may be located outside the slot 411, that is, an orthographic projection of the second conductive portion 55 on the base substrate does not intersect with the orthographic projection of the slot 411 on the base substrate.

It should be noted that in this exemplary embodiment, different structural portions in the same structural film layer (for example, the first conductive layer and the second conductive layer) may be formed by one (one-time) patterning process. As for the description in this disclosure, i.e., "an A layer (any structural film layer) is located at a side of a B layer (any structural film layer) facing away from the base substrate", when the B layer is a patterned structural film layer, the A layer may include not only a part directly above the B layer, but also a part filled in the hollowed-out area of the B layer, that is, the A layer may include an X portion directly above the B layer and other structural portions formed with the X portion by one patterning process or one deposition process, and an orthographic projection of the X portion on the base substrate coincides with an orthographic projection of the B layer on the base substrate. For example, as shown in FIG. 3, the first dielectric layer 43 includes not only a part directly above the first conductive portion 13, but also other parts formed by the same deposition process. The second conductive layer may include not only the second conductive portion 55 located directly above the first buffer layer 41, but also the third conductive portion 721 formed by one patterning process with the second conductive portion 55.

The array substrate provided by this exemplary embodiment is provided with a slot 411 on the first buffer layer 41, and a third conductive portion 721 is provided at the bottom portion of the slot 411. The arrangement of the slot 411 reduces the distance between the third conductive portion 721 and the first conductive portion 13, so that the third conductive portion 721 and the first conductive portion 13 may form two electrodes of the capacitor C. On the one hand, it is not required to design the first conductive portion 013 with a larger area as a capacitor electrode in the related art, thus reducing the influence on the gate electrode of the driving transistor due to the noise of external signals. On the other hand, the array substrate provided by this exemplary embodiment may not be provided with the second source-drain layer in the related art, thus simplifying the structure of the array substrate.

It should be understood that in other exemplary embodiments, the pixel driving circuit may have other structures, and the array substrate including a LTPO pixel driving circuit may adopt the above structure to form the capacitance of the corresponding pixel driving circuit.

Figure 4A:
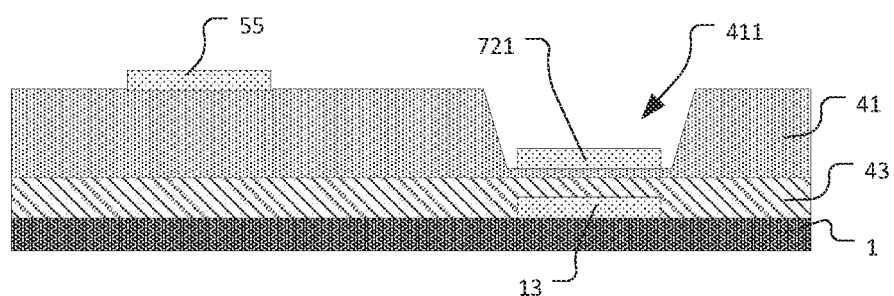
FIG. 4a is a structural schematic diagram of an array substrate of another exemplary embodiment of the present disclosure.
Figure 4B:
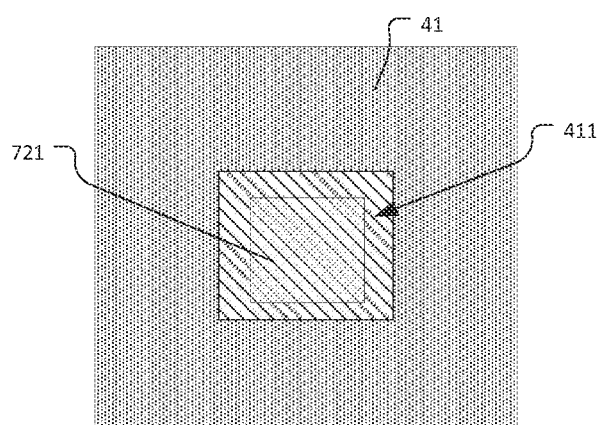
FIG. 4b is a partial top view of FIG. 3.
Figure 4C:
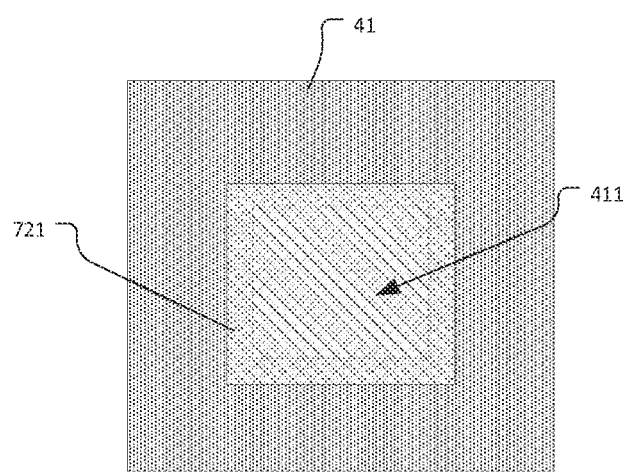
FIG. 4c is a partial top view of an array substrate of another exemplary embodiment of the present disclosure.
Figure 4D:
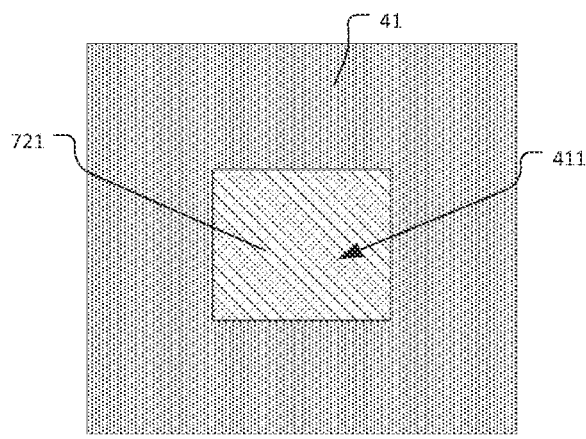
FIG. 4d is a partial top view of an array substrate of another exemplary embodiment of the present disclosure.

In this exemplary embodiment, as shown in FIG. 3, the slot 411 may extend to a surface of the first dielectric layer 43, that is, the bottom portion of the slot 411 may be formed by the first dielectric layer 43, and the third conductive portion 721 may be located at a side of the first dielectric layer 43 facing away from the base substrate 1. The first dielectric layer 43 located between the first conductive portion 13 and the third conductive portion 721 may be used as a dielectric layer of the parallel plate capacitor structure. It should be understood that in other exemplary embodiments, the slot 411 may also extend to other positions, for example, as shown in FIG. 4a, which is a structural schematic diagram of an array substrate of another exemplary embodiment of the present disclosure. The slot 411 may extend into the first buffer layer 41, that is, the bottom portion of the slot 411 is formed by a part of the first buffer layer 41. As shown in FIG. 4b, which is a partial top view of FIG. 3, an orthographic projection area of the third conductive portion 721 on the base substrate is smaller than an orthographic projection area of the bottom portion of the slot 411 on the base substrate, and the third conductive portion 721 is located at the bottom portion of the slot 411. It should be understood that, in other exemplary embodiments, the orthographic projection area of the third conductive portion 721 on the base substrate may also be greater than or equal to the orthographic projection area of the bottom portion of the slot 411 on the base substrate. As shown in FIG. 4c, which is a partial top view of an array substrate of another exemplary embodiment of the present disclosure, the orthographic projection area of the third conductive portion 721 on the base substrate is larger than the orthographic projection area of the bottom portion of the slot 411 on the base substrate. As shown in FIG. 4d, which is a partial top view of an array substrate of another exemplary embodiment of the present disclosure, the orthographic projection area of the third conductive portion 721 on the base substrate is equal to the orthographic projection area of the bottom portion of the slot 411 on the base substrate.

Figure 5:
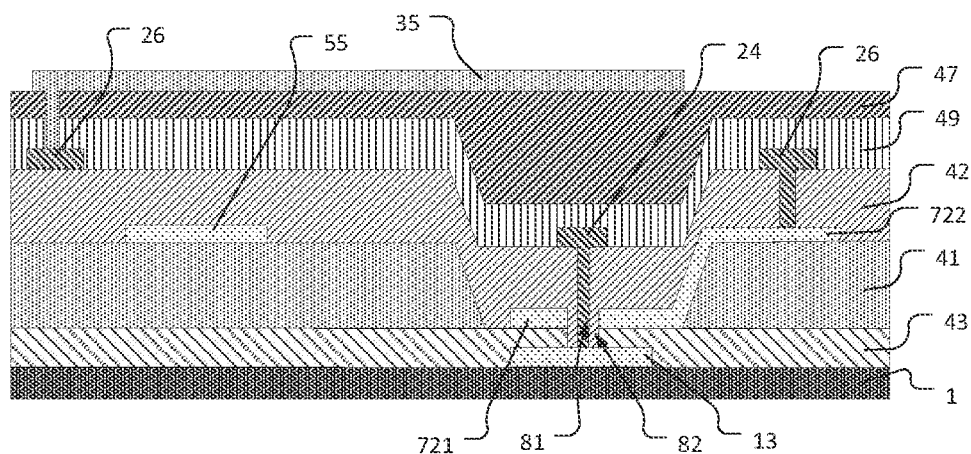
FIG. 5 is a structural schematic diagram of an array substrate of another exemplary embodiment of the present disclosure.

In this exemplary embodiment, as shown in FIG. 5, FIG. 5 is a structural schematic diagram of an array substrate of another exemplary embodiment of the present disclosure. The array substrate may further include a third conductive layer. The third conductive layer may be laminated at a side of the second conductive layer facing away from the base substrate 1, and may include a fourth conductive portion 24. The fourth conductive portion 24 may be electrically connected with the first conductive portion 13 through a first via hole 81 penetrating through the third conductive portion 721 and insulated from the third conductive portion 721. The orthographic projection of the fourth conductive portion 24 on the base substrate 1 may be located on the orthographic projection of the first conductive portion 13 on the base substrate 1, and the orthographic projection area of the fourth conductive portion 24 on the base substrate 1 may be smaller than that of the first conductive portion 13 on the base substrate.

In this exemplary embodiment, the fourth conductive portion 24 is provided to have a smaller area. On the one hand, the parasitic capacitances between the fourth conductive portion 24 and other conductive structures (such as a data line, an anode layer, or the like) can be reduced, thereby reducing the influence on the gate electrode of the driving transistor due to the noise of other structures; on the other hand, the fourth conductive portion 24 can be conveniently shielded by the shielding layer, thereby further reducing the influence on the gate electrode of the driving transistor due to the noise of other structures. A ratio of the orthographic projection area of the fourth conductive portion 24 on the base substrate 1 to the orthographic projection area of the first conductive portion 13 on the base substrate may be 4%-25%. For example, the ratio of the orthographic projection area of the fourth conductive portion 24 on the base substrate 1 to the orthographic projection area of the first conductive portion 13 on the base substrate may be any one of 4%, 8%, 10%, 12%, 15%, 20% and 25%.

In this exemplary embodiment, the ratio of the orthographic projection area of the fourth conductive portion 24 on the base substrate 1 to that of the first via hole 81 on the base substrate may be 1-2.5, for example, the ratio of the orthographic projection area of the fourth conductive portion 24 on the base substrate 1 to that of the first via hole 81 on the base substrate may be 1, 1.2, 1.3, 1.5, 2.0, 2.3, 2.5 or the like. It should be understood that in other exemplary embodiments, due to reasons such as process error and so forth, the orthographic projection area of the fourth conductive portion 24 on the base substrate 1 may also be slightly smaller than the orthographic projection area of the first via hole 81 on the base substrate.

In this exemplary embodiment, as shown in FIG. 5, a second via hole 82 may be formed on the third conductive portion 721, and may extend through the first dielectric layer 43 to an upper surface of the first conductive portion 13. The array substrate may further include a second dielectric layer 42, and the second dielectric layer 42 may be laminated between the second conductive layer and the third conductive layer, and fill the second via hole 2. The first via hole 81 may be formed on the second dielectric layer 42, may extend through the third conductive portion 721 to the upper surface of the first conductive portion 13, and has an orthographic projection on the base substrate 1 located within the orthographic projection of the second via hole 82 on the base substrate. With this arrangement, the fourth conductive portion 24 may be electrically connected with the first conductive portion 13, and may be insulated from the third conductive portion 721. With regard to the above description, i.e., "the first via hole 81 has an orthographic projection on the base substrate 1 located within the orthographic projection of the second via hole 82 on the base substrate", it can be understood that the orthographic projection of the first via hole 81 on the base substrate is located on the orthographic projection of the second via hole 82 on the base substrate, and there is a distance between an edge of the orthographic projection of the first via hole 81 on the base substrate and an edge of the orthographic projection of the second via hole 82 on the base substrate.

In this exemplary embodiment, as shown in FIG. 5, the third conductive layer may further include a power line 26 for providing a power supply voltage, and the array substrate may further include a passivation layer 49, a first flat layer 47, and a fourth conductive layer. The passivation layer 49 may be laminated at a side of third conductive layer facing away from the base substrate 1. The first flat layer 47 may be laminated at a side of the passivation layer 49 facing away from the base substrate 1. The fourth conductive layer may be laminated at a side of the first flat layer 47 facing away from the base substrate 1, and may include a fifth conductive portion 35 connected with the power line 26, and an orthographic projection of the fifth conductive portion 35 on the base substrate may cover the orthographic projection of the first conductive portion on the base substrate. The power line 26 may be configured to provide a first power terminal VDD in FIG. 1. Since the fifth conductive portion 35 is connected with a stable voltage and the orthographic projection of the fifth conductive portion 35 on the base substrate may cover the orthographic projection of the first conductive portion 13 on the base substrate, the fifth conductive portion 35 may act as a shielding layer to shield the influence on the first conductive portion 13 due to the noise of other signals.

In this exemplary embodiment, as shown in FIG. 5, the second conductive layer may further include a sixth conductive portion 722 connected with the third conductive portion 721, and the sixth conductive portion 722 may be connected with the power line 26 through a via hole, so that the second electrode of the capacitor is connected with the first power terminal VDD.

It should be noted that the power line 26 may extend in one direction, and the reason why the power line 26 appears at two different positions in FIG. 5 is that FIG. 5 is a sectional view along a bending line on the layout structure of the array substrate, and the position of the bending line will be described in detail in the layout structure of the array substrate below.

Figure 6:
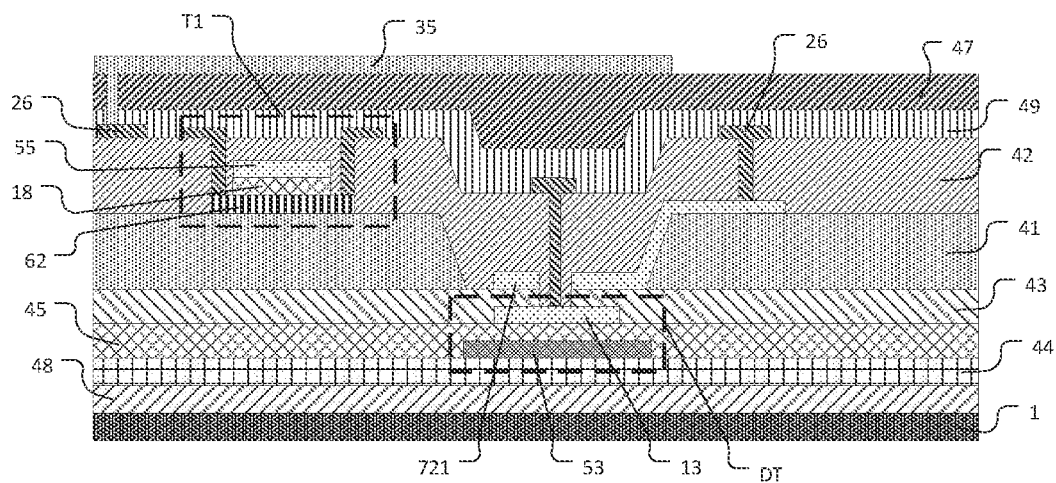
FIG. 6 is a structural schematic diagram of an array substrate of another exemplary embodiment of the present disclosure.

In this exemplary embodiment, FIG. 6 is a structural schematic diagram of an array substrate of another exemplary embodiment of the present disclosure. The array substrate may further include a barrier layer 48, a second buffer layer 44, a first active layer, a second gate insulating layer 45, a second active layer and a first gate insulating layer 18. The base substrate 1, the barrier layer 48, the second buffer layer 44, the first active layer, the second gate insulating layer 45, the first conductive layer, the first dielectric layer 43, the first buffer layer 41, the second active layer, the first gate insulating layer 18, the second conductive layer, the second dielectric layer 42, the third conductive layer, the passivation layer 49, the first flat layer 47, and the fourth conductive layer are sequentially laminated. The first active layer may include a first active portion 53, which may be configured as a channel region of the driving transistor DT. The second active layer may include a second active portion 62, which may be configured as a channel region of the first transistor T1.

Figure 7:
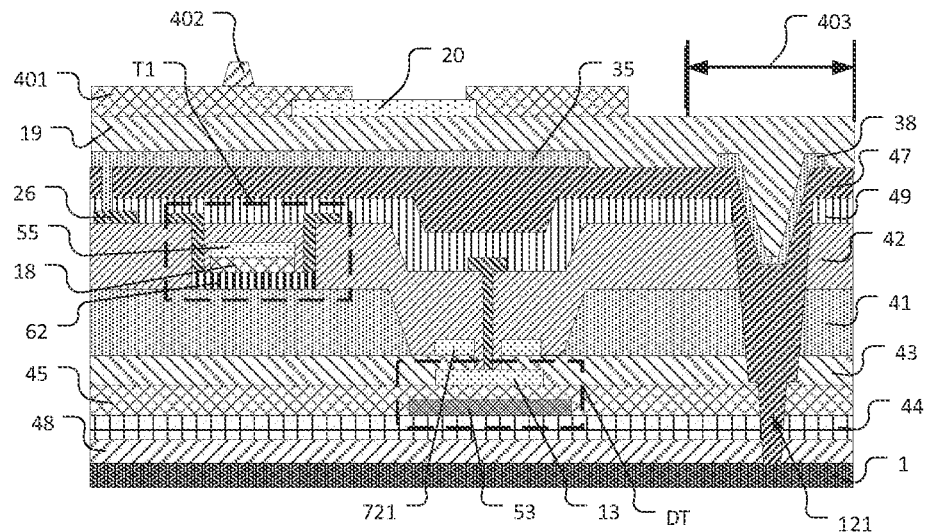
FIG. 7 is a structural schematic diagram of an array substrate of another exemplary embodiment of the present disclosure.

In this exemplary embodiment, FIG. 7 is a structural schematic diagram of an array substrate of another exemplary embodiment of the present disclosure. The array substrate may include a non-display area 403, and a strip-shaped groove 121 is formed in the non-display area 403 on the array substrate. The strip-shaped groove 121 may extend through the passivation layer 49, the second dielectric layer 42, the first buffer layer 41, the first dielectric layer 43, the second gate insulation layer 45, the second buffer layer 44 and the barrier layer 48 to a surface of the base substrate 1. The first flat layer 47 may be filled into the strip-shaped groove 121. The bendable performance of the material of the first flat layer 47 may be stronger than that of the material of any of the passivation layer 49, the second dielectric layer 42, the first buffer layer 41, the first dielectric layer 43, the second gate insulating layer 45, the second buffer layer 44 and the barrier layer 48. For example, the first flat layer 47 may be made of an organic material, and the passivation layer 49, the second dielectric layer 42, the first buffer layer 41, the first dielectric layer 43, the second gate insulating layer 45, the second buffer layer 44 and the barrier layer 48 may be made of inorganic materials. The position in which the strip-shaped groove 121 is located may act as a bending area to bend the chip connected with the array substrate to the back surface of the array substrate. As shown in FIG. 7, the fourth conductive layer may further include a signal line 38, which may be located in the non-display area 403.

In this exemplary embodiment, as shown in FIG. 7, the array substrate may further include a second flat layer 19, an anode layer 20 and a pixel definition layer 401. The second flat layer 19 may be laminated at a side of the fourth conductive layer facing away from the base substrate 1. The anode layer 20 may be laminated at a side of the second flat layer 19 facing away from the base substrate 1. The pixel definition layer 401 may be laminated at a side of the anode layer facing away from the base substrate 1. The anode layer 20 may be configured as an anode of the light emitting unit in FIG. 1. The pixel definition layer 401 may form a pixel opening for depositing the light emitting unit. In addition, a supporting column 402 may be further provided at a side of the pixel definition layer 401 facing away from the base substrate, and may be configured to support a mask plate.

In this exemplary embodiment, the base substrate may include a first polyimide (PI) layer, a first silicon oxide (SiO) layer, an amorphous silicon layer, a second polyimide (PI) layer, and a second silicon oxide layer which are sequentially laminated. The barrier layer 48 may be located at a side of the second silicon oxide layer facing away from the first polyimide (PI) layer. Thicknesses of both the first polyimide (PI) layer and the second polyimide (PI) layer may be 90,000-110,000±5% angstroms (Å), such as 90,000 angstroms, 95,000 angstroms and 110,000 angstroms. A thickness of the first silicon oxide layer may be 5,000-7,000 angstroms, such as 5,000 angstroms, 5,500 angstroms and 7,000 angstroms. A thickness of the amorphous silicon layer may be 40-60 angstroms, for example, 40 angstroms, 45 angstroms and 60 angstroms. A thickness of the second silicon oxide layer may be 4,500-6,500 angstroms, such as 4,500 angstroms, 5,000 angstroms and 6,500 angstroms.

In this exemplary embodiment, the second buffer layer 44 may include a first silicon nitride (SiN) layer and a third silicon oxide layer which are sequentially laminated, and the first silicon nitride layer may be located between the third silicon oxide layer and the base substrate. A thickness of the first silicon nitride layer may be 900-1,100 angstroms, such as 900 angstroms, 950 angstroms and 1,100 angstroms. A thickness of the third silicon oxide layer may be 2,000-4,000 angstroms, for example, 2,000 angstroms, 2,500 angstroms and 4,000 angstroms. The first active layer may be a polysilicon layer, and may have a thickness of 400-600 angstroms, for example, 400 angstroms, 500 angstroms and 600 angstroms. The second gate insulating layer 45 may be a silicon oxide layer, and may have a thickness of 500-2,000 angstroms, for example, 500 angstroms, 1,500 angstroms and 2,000 angstroms. The first conductive layer and the second conductive layer may be molybdenum layers, and may have a thickness of 1,500-2,500 angstroms, such as 1,500 angstroms, 2,000 angstroms and 2,500 angstroms. The first dielectric layer 43 may be a silicon nitride layer, and may have a thickness of 1,200-1,400 angstroms, for example, 1,200 angstroms, 1,250 angstroms, 1,300 angstroms, 1,350 angstroms and 1,400 angstroms. The first buffer layer 41 may be a silicon oxide layer, and may have a thickness of 3,000-5,000 angstroms, for example, 3,000 angstroms, 3,500 angstroms and 5,000 angstroms. The second active layer may be an indium gallium zinc oxide (IGZO) layer, and may have a thickness of 300-500 angstroms, for example, 300 angstroms, 350 angstroms and 500 angstroms. The second gate insulating layer 45 may be a silicon oxide layer, and may have a thickness of 1,000-2,000 angstroms, for example, 1,000 angstroms, 1,500 angstroms and 2,000 angstroms. The third conductive layer may include a first titanium layer, an aluminum layer, and a second titanium layer sequentially laminated. A thickness of any of the first titanium layer and the second titanium layer may be 300-700 angstroms, for example, 300 angstroms, 450 angstroms and 700 angstroms. A thickness of the aluminum layer may be 4,500-6,500 angstroms, for example, 4,500 angstroms, 5,000 angstroms, and 6,500 angstroms. The second flat layer 19 may be a polyimide (PI) layer, and may have a thickness of 10,000-20,000 angstroms, for example, 10,000 angstroms, 16,000 angstroms and 20,000 angstroms. The pixel definition layer 401 may be a polyimide (PI) layer, and may have a thickness of 10,000-20,000 angstroms, for example, 10,000 angstroms, 16,000 angstroms and 20,000 angstroms. The supporting column 402 may be a polyimide (PI) layer, and may have a thickness of 10,000-20,000 angstroms, for example, 10,000 angstroms, 16,000 angstroms and 20,000 angstroms. The anode layer 20 may include a first indium tin oxide layer, a silver layer and a second indium tin oxide layer which are sequentially laminated. Thicknesses of both the first indium tin oxide layer and the second indium tin oxide layer may be 50-100 angstroms, such as 50 angstroms, 80 angstroms and 100 angstroms, and a thickness of the silver layer may be 500-1,500 angstroms, such as 500 angstroms, 800 angstroms and 1,500 angstroms.

It should be understood that the structural film layer may also be made of other materials and in other thicknesses. For example, the dielectric layer and the passivation layer may also be made of silicon nitride or transparent organic resin etc., and the flat layer may also be made of transparent polyimide (CPI), polyethylene terephthalate (PET), polyethylene naphthalate (PEN) or other materials. The conductive layer may also be made of metal materials such as copper and molybdenum.

An exemplary embodiment of the present disclosure also provides a fabrication method of an array substrate. The array substrate may include a pixel driving circuit including a P-type driving transistor, an N-type first transistor and a capacitor, wherein a first electrode of the first transistor is connected with a gate electrode of the driving transistor, and a first electrode of the capacitor is connected with a gate electrode of the driving transistor. The fabrication method of the array substrate includes:

Step S1: forming a base substrate;

Step S2: forming a first conductive layer at a side of the base substrate, wherein the first conductive layer includes a first conductive portion, and the first conductive portion is configured as a gate electrode of the driving transistor and a first electrode of the capacitor;

Step S3: forming a first dielectric layer at a side of the first conductive layer facing away from the base substrate; wherein a first buffer layer is formed at a side of the first dielectric layer facing away from the base substrate, the first buffer layer is provided with a slot thereon, and an orthographic projection of the slot on the base substrate is at least partially overlapped with an orthographic projection of the first conductive portion on the base substrate;

Step S4: forming a second conductive layer at a side of the first buffer layer facing away from the first conductive layer, wherein the second conductive layer includes:
 a second conductive portion configured as a gate electrode of the first transistor;
 a third conductive portion located at the bottom portion of the slot, and an orthographic projection of the third conductive portion on the base substrate is at least partially overlapped with an orthographic projection of the first conductive portion on the base substrate to form a second electrode of the capacitor.

Figure 8:
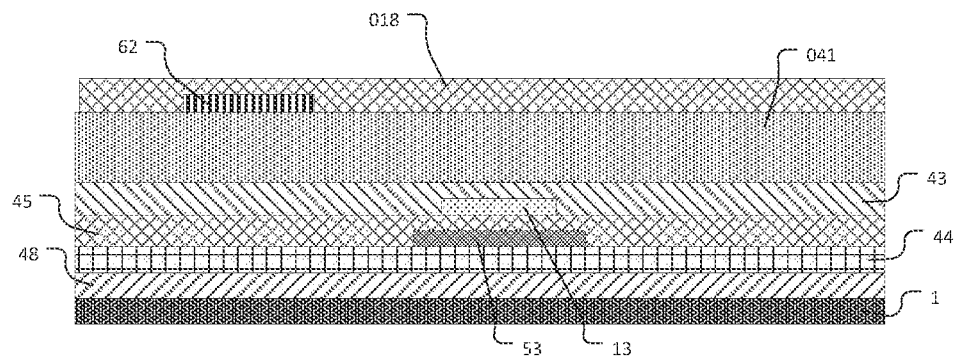
FIGS. 8-14 are process flow diagrams of a fabrication method of an array substrate of an exemplary embodiment of the present disclosure.

FIG. 8 is a process flow diagram of a fabrication method of an array substrate of an exemplary embodiment of the present disclosure. The fabrication method of the array substrate may further include a step of sequentially forming a barrier layer 48, a second buffer layer 44, a first active layer, a second gate insulating layer 45, a first conductive layer, a first dielectric layer 43, a first buffer material layer 041, a second active layer and a first gate insulating material layer 018 on the base substrate 1. The first active layer may include a first active portion 53, the first conductive layer may include a first conductive portion 13 configured as a gate electrode of the driving transistor, and the second active layer may include a second active portion 62.

Figure 9:
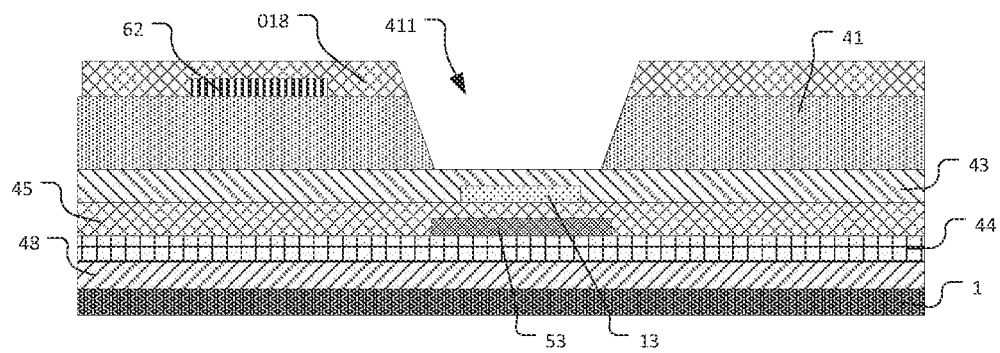
Figure 10:
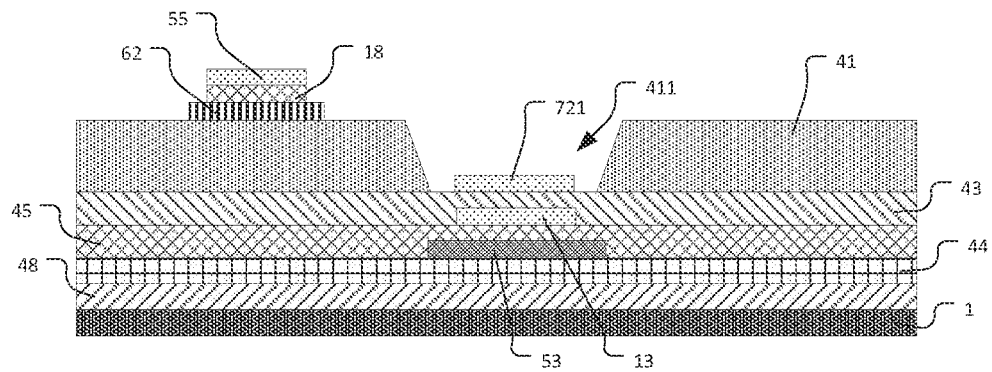

FIGS. 9 and 10 show process flow diagrams of the fabrication method of the array substrate of an exemplary embodiment of the present disclosure. As shown in FIG. 9, the fabrication method of the array substrate may further include a step of etching the first buffer material layer 041 and the first gate insulating material layer 018 through a patterning process to form the slot 411, and the etched first buffer material layer 041 forms a first buffer layer. The slot 411 may extend to a first surface of the first dielectric layer 43, and the third conductive portion may be located on the first surface of the first dielectric layer, wherein the first surface is a surface of the first dielectric layer facing the first buffer layer. As shown in FIG. 10, the fabrication method of the array substrate may further include a step of forming a second conductive layer through a patterning process, wherein the second conductive layer may include a third conductive portion 721 and a second conductive portion 55 configured as a gate electrode of the first transistor, and the third conductive portion 721 may be located at the bottom portion of the slot 411. When the second conductive layer is formed by the patterning process, the first gate insulating material layer 018 may also be simultaneously patterned to form the first gate insulating layer 18. It should be understood that in other exemplary embodiments, the fabrication method of the array substrate may also include a step of etching only any one of the first buffer material layer 041 and the first gate insulating material layer 018 through a patterning process to form the slot 411.

Figure 11:
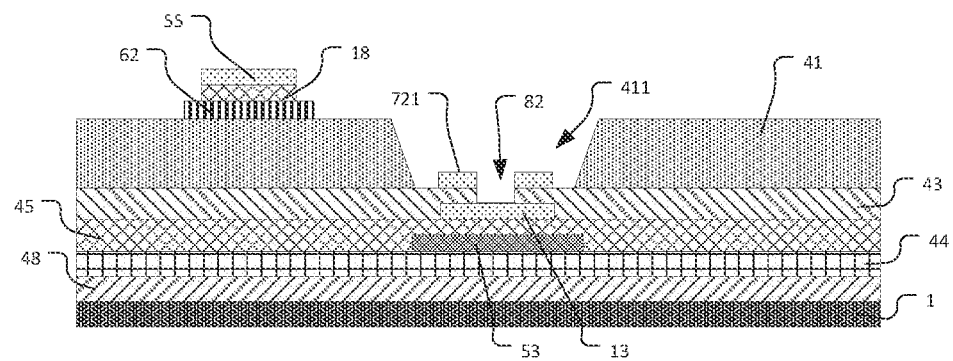
Figure 12:
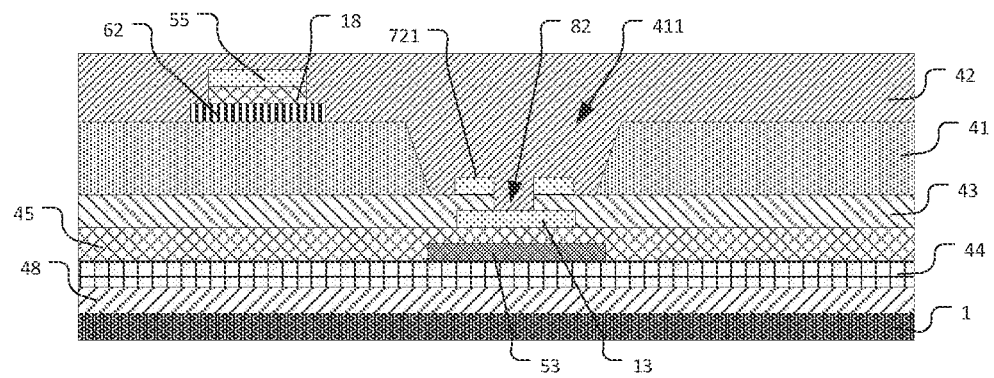
Figure 13:
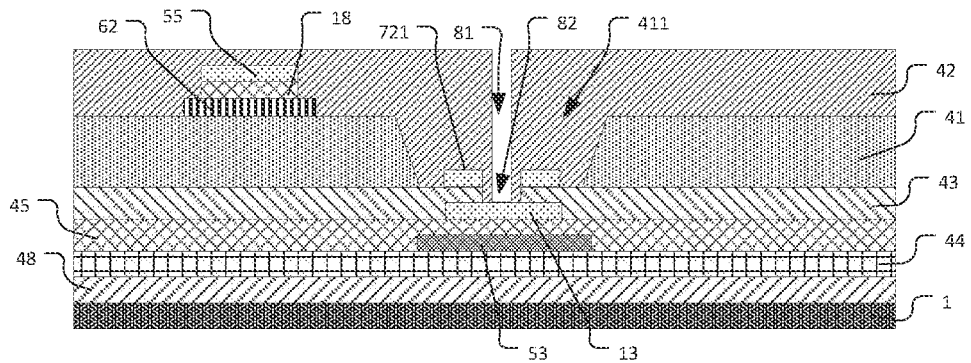
Figure 14:
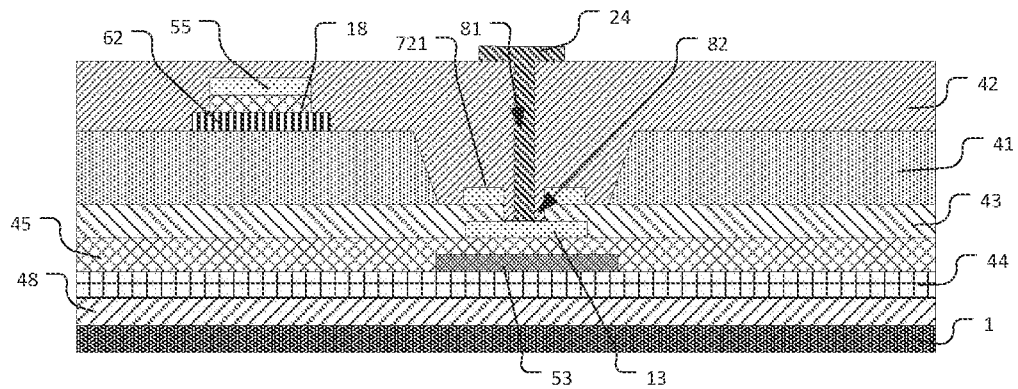

FIGS. 11-14 show process flow diagrams of the array substrate fabrication method of an exemplary embodiment of the present disclosure. As shown in FIG. 11, the fabrication method of the array substrate may further include a step of forming a second via hole 82 on the third conductive portion, wherein the second via hole 82 may extend through the first dielectric layer 43 to the surface of the first conductive portion 13. As shown in FIG. 12, a second dielectric layer 42 is formed at a side of the second conductive layer facing away from the base substrate 1, and the second dielectric layer 42 fills the second via hole 82. As shown in FIG. 13, the first via hole 81 is formed on the second dielectric layer 42 and extends through the third conductive portion 721 to the surface of the first conductive portion 13. An orthographic projection of the first via hole 81 on the base substrate 1 is within an orthographic projection of the second via hole 82 on the base substrate. As shown in FIG. 14, the fabrication method of the array substrate may further include a step of forming a third conductive layer at a side of the second dielectric layer 42 facing away from the base substrate 1, wherein the third conductive layer may include a fourth conductive portion 24, which may be electrically connected with the first conductive portion 13 through the first via hole 81. An orthographic projection of the fourth conductive portion 24 on the base substrate 1 may be located on the orthographic projection of the first conductive portion 13 on the base substrate 1, and an orthographic projection area of the fourth conductive portion 24 on the base substrate may be smaller than that of the first conductive portion 13 on the base substrate.

In this exemplary embodiment, the fourth conductive portion 24 is provided to have a smaller area. On the one hand, the parasitic capacitance between the fourth conductive portion 24 and other conductive structures (such as a data line, an anode layer, or the like) can be reduced, thereby reducing the influence on the gate electrode of the driving transistor due to the noise of other structures; on the other hand, the fourth conductive portion 24 can be conveniently shielded by the shielding layer, thereby further reducing the influence on the gate electrode of the driving transistor due to the noise of other structures. The orthographic projection area of the fourth conductive portion 24 on the base substrate 1 may be 4%-25% of the orthographic projection area of the first conductive portion 13 on the base substrate. For example, the ratio of the orthographic projection area of the fourth conductive portion 24 on the base substrate 1 to the orthographic projection area of the first conductive portion 13 on the base substrate may be any one of 4%, 8%, 10%, 12%, 15%, 20% and 25%.

In this exemplary embodiment, the ratio of the orthographic projection area of the fourth conductive portion 24 on the base substrate 1 to the orthographic projection area of the first via hole 81 on the base substrate may be 1-2.5. For example, the ratio of the orthographic projection area of the fourth conductive portion 24 on the base substrate 1 to the orthographic projection area of the first via hole 81 on the base substrate may be 1, 1.2, 1.3, 1.5, 2.0, 2.3, 2.5 or the like.

In this exemplary embodiment, the fabrication method of the array substrate may further include a step of sequentially forming a second dielectric layer, a third conductive layer, a passivation layer, a first flat layer, a fourth conductive layer, a second flat layer, an anode layer and a pixel definition layer at a side of the third conductive layer facing away from the base substrate, so as to form the array substrate structure shown in FIG. 7.

The overall structure of the array substrate will be described in detail in this exemplary embodiment.

Figure 15:
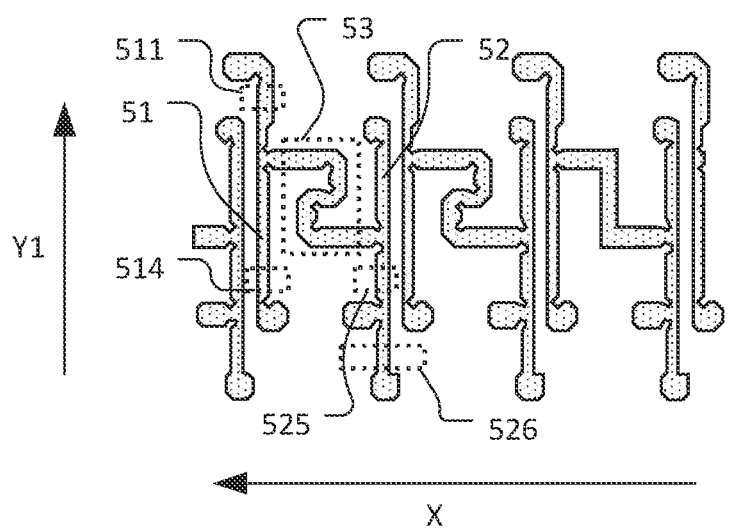
FIG. 15 is a structural layout of a first active layer.
Figure 16:
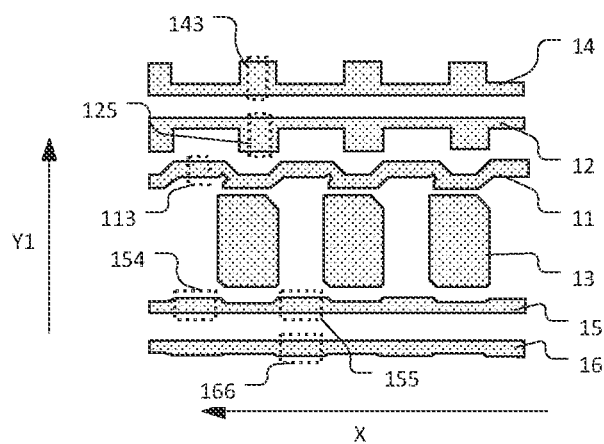
FIG. 16 is a structural layout of a first conductive layer.
Figure 17:
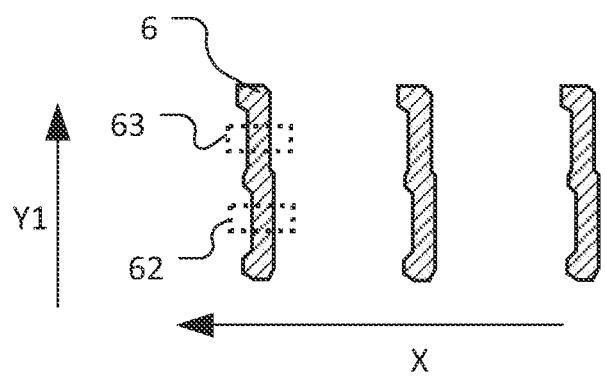
FIG. 17 is a structural layout of a second active layer.
Figure 18:
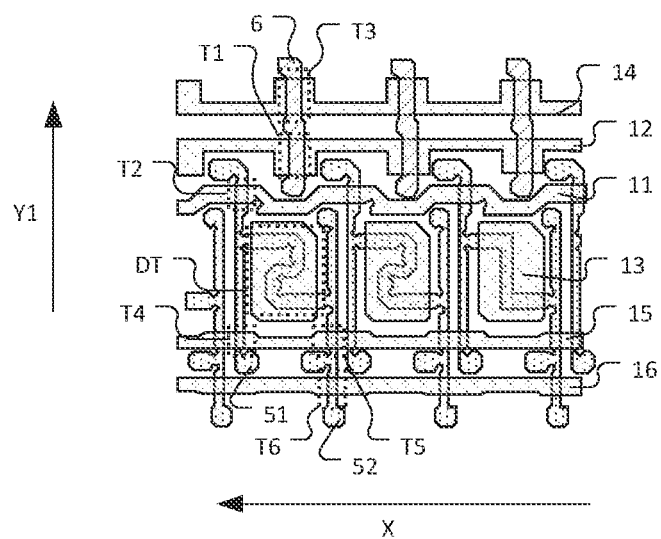
FIG. 18 is a combined layout of a first active layer, a first conductive layer and a second active layer.
Figure 19:
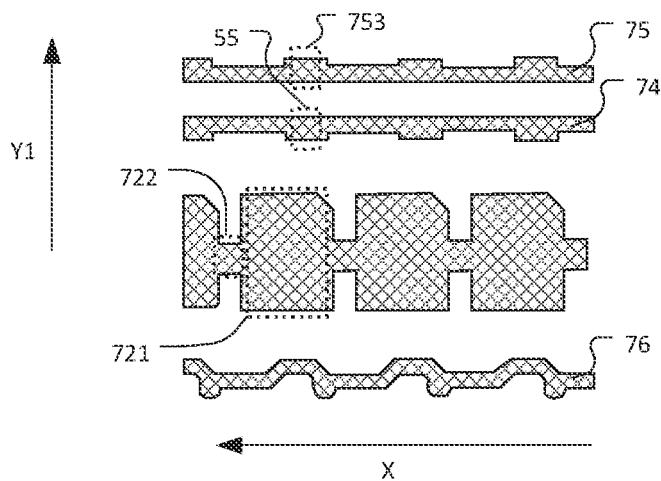
FIG. 19 is a structural layout of a second conductive layer.
Figure 20:
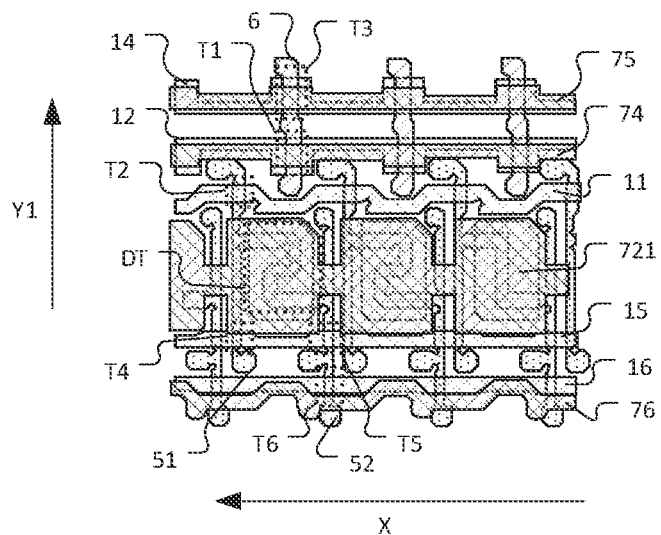
FIG. 20 is a combined layout of a first active layer, a first conductive layer, a second active layer and a second conductive layer.
Figure 21:
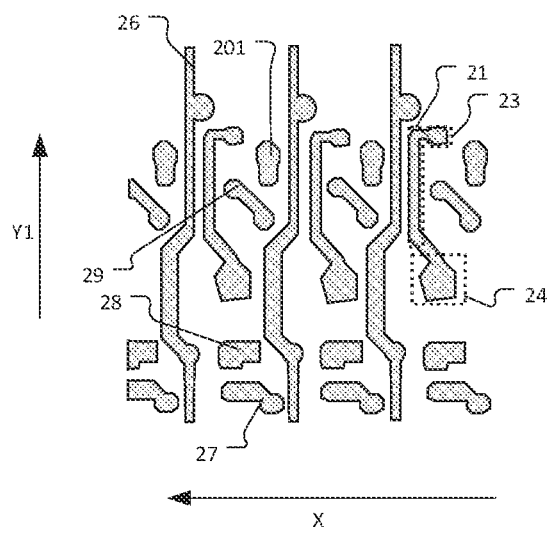
FIG. 21 is a structural layout of a third conductive layer.
Figure 22:
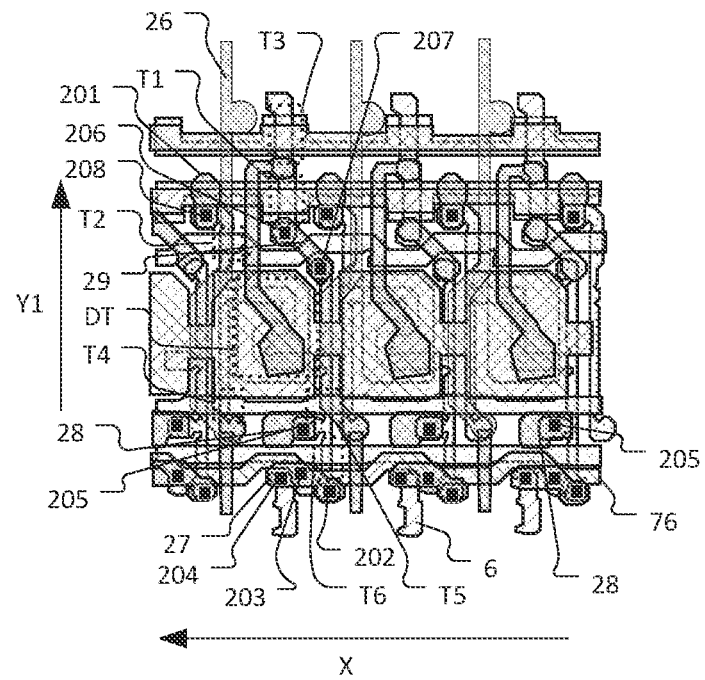
FIG. 22 is a combined layout of a first active layer, a first conductive layer, a second active layer, a second conductive layer and a third conductive layer.
Figure 23:
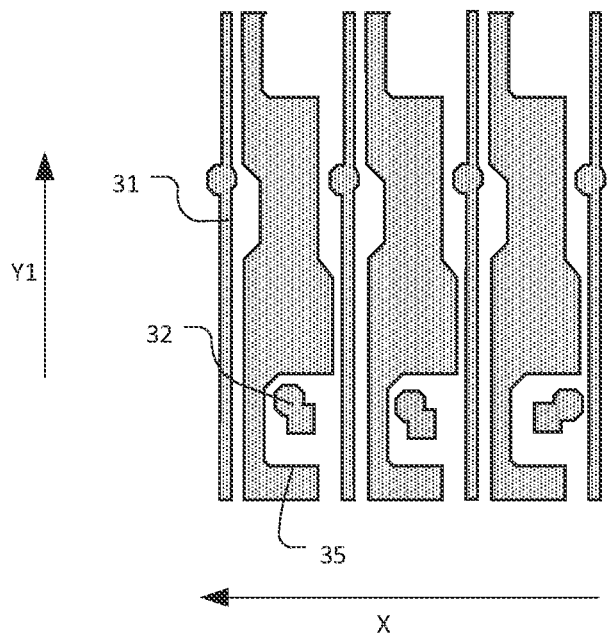
FIG. 23 is a structural layout of a fourth conductive layer.
Figure 24:
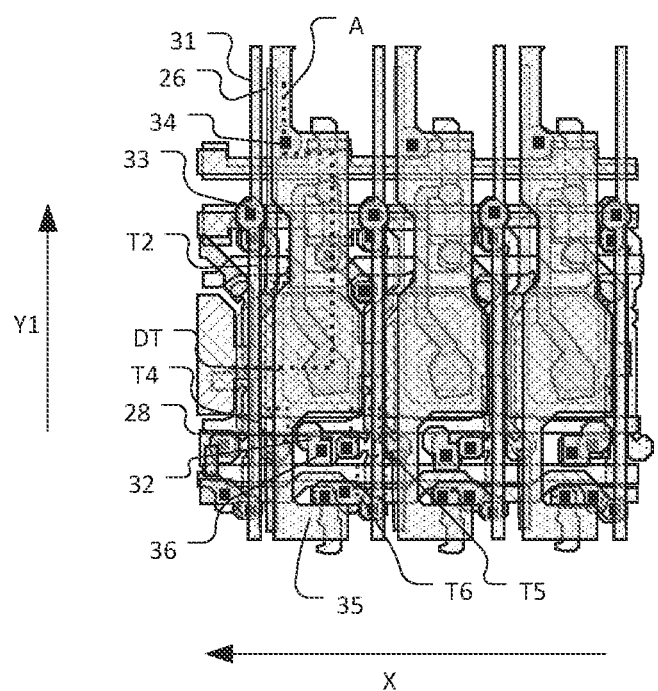
FIG. 24 is a combined layout of a first active layer, a first conductive layer, a second active layer, a second conductive layer, a third conductive layer and a fourth conductive layer.
Figure 25:
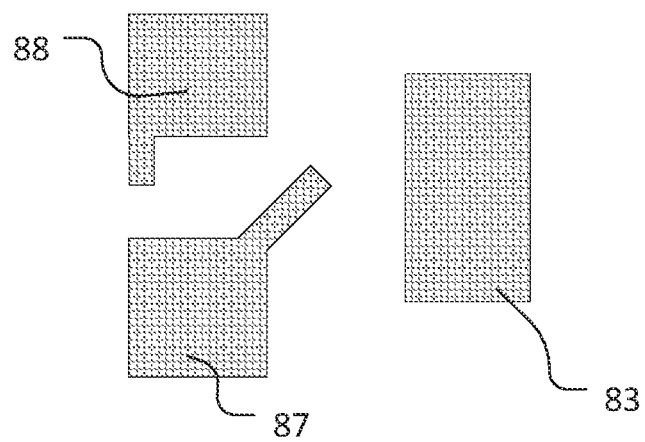
FIG. 25 is a structural layout of an anode layer.
Figure 26:
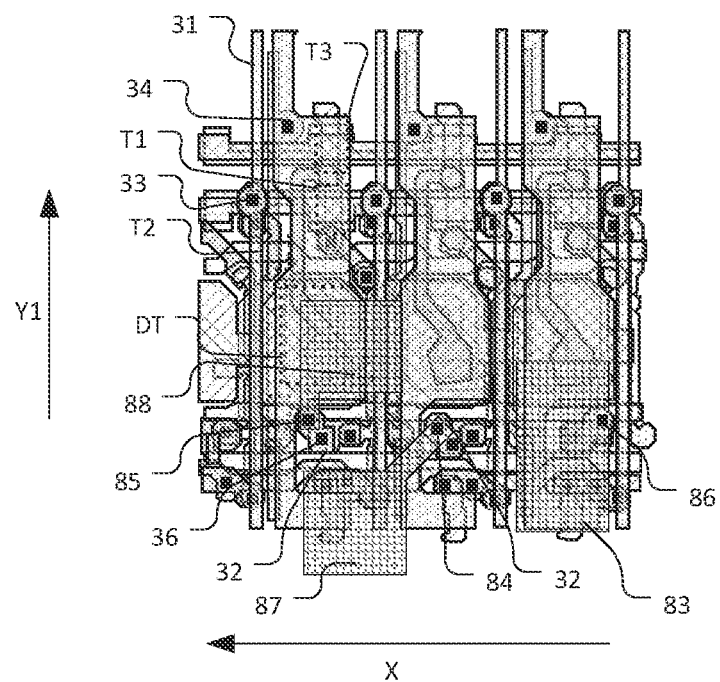
FIG. 26 is a combined layout of a first active layer, a first conductive layer, a second active layer, a second conductive layer, a third conductive layer, a fourth conductive layer and an anode layer.

As shown in FIGS. 15-26, FIG. 15 is a structural layout of a first active layer; FIG. 16 is a structural layout of a first conductive layer; FIG. 17 is a structural layout of a second active layer; FIG. 18 is a combined layout of a first active layer, a first conductive layer and a second active layer; FIG. 19 is a structural layout of a second conductive layer; FIG. 20 is a combined layout of a first active layer, a first conductive layer, a second active layer and a second conductive layer; FIG. 21 is a structural layout of a third conductive layer; FIG. 22 is a combined layout of a first active layer, a first conductive layer, a second active layer, a second conductive layer and a third conductive layer; FIG. 23 is a structural layout of a fourth conductive layer; FIG. 24 is a combined layout of a first active layer, a first conductive layer, a second active layer, a second conductive layer, a third conductive layer and a fourth conductive layer; FIG. 25 is a structural layout of an anode layer; FIG. 26 is a combined layout of a first active layer, a first conductive layer, a second active layer, a second conductive layer, a third conductive layer, a fourth conductive layer and an anode layer.

As shown in FIGS. 15 and 18, the first active layer may include the first active portion 53 described above. In addition, the first active layer may also include a third active portion 51 and a fourth active portion 52 extending along a first direction Y1, wherein the third active portion 51 and the fourth active portion 52 may be distributed at intervals along a second direction X. The first active portion 53 may be connected between the third active portion 51 and the fourth active portion 52. The third active portion 51 may include a first active sub-portion 511 and a second active sub-portion 514, and the fourth active portion 52 may include a third active sub-portion 525 and a fourth active sub-portion 526.

The first active portion 53 may be configured as a channel region of the driving transistor DT; the first active sub-portion 511 may be configured as a channel region of the second transistor T2; the second active sub-portion 514 may be configured as a channel region of the fourth transistor T4; the third active sub-portion 525 may be configured as a channel region of the fifth transistor T5; the fourth active sub-portion 526 may be configured as a channel region of the sixth transistor T6. In this exemplary embodiment, the first active layer may be made of a polysilicon material, and correspondingly, the driving transistor DT, the second transistor T2, the fourth transistor T4, the fifth transistor T5 and the sixth transistor T6 may be P-type low-temperature polysilicon transistors. The orthographic projection of the third conductive portion 721 on the base substrate may not be overlapped with the orthographic projection of the fourth active portion 52 on the base substrate, thereby avoiding unnecessary parasitic capacitance between the third conductive portion 721 and the fourth active portion 52.

As shown in FIG. 18 and FIG. 16, the first conductive layer may include the first conductive portion 13 described above, and may also include a first gate line 11, a second gate line 12, a third gate line 14, a fifth gate line 15 and a sixth gate line 16. The first gate line 11 may be located at a side of the first conductive portion 13; the second gate line 12 may be located at a side of the first gate line 11 away from the first conductive portion 13; the third gate line 14 may be located at a side of the second gate line 12 away from the first conductive portion 13; the fifth gate line 15 is located at a side of the first conductive portion 13 away from the first gate line; the sixth gate line 16 is located at a side of the fifth gate line 15 away from the first conductive portion 13. The first gate line 11, the second gate line 12, the third gate line 14, the fifth gate line 15 and the sixth gate line 16 may all extend along the second direction X. The first gate line 11 may be configured to provide a first gate driving signal terminal G1 shown in FIG. 1, and may include a first gate portion 113. The second gate line 12 may be configured to provide a second gate driving signal terminal G2 shown in FIG. 1, and may include a second gate portion 125. The third gate line 14 may serve as a second reset signal line for providing a second reset signal terminal Re2 shown in FIG. 1, and may include a third gate portion 143. The fifth gate line 15 may serve as an enable signal line for providing an enable signal terminal EM shown in FIG. 1, and may include a fourth gate portion 154 and a fifth gate portion 155. The sixth gate line 16 may serve as a first reset signal line for providing a first reset signal terminal Re1 shown in FIG. 1, and includes a sixth gate portion 166. The first gate portion 113 may be configured as a gate electrode of the second transistor T2, and the second gate portion 125 may be configured as a first gate electrode of the first transistor T1. The third gate portion 143 may be configured as a first gate electrode of the third transistor T3. The fourth gate portion 154 may be configured as a gate electrode of the fourth transistor T4. The fifth gate portion 155 may be configured as a gate electrode of the fifth transistor T5. The sixth gate portion 166 may be configured as a gate electrode of the sixth transistor T6.

As shown in FIG. 18 and FIG. 17, the second active layer may include a plurality of active portions 6 extending along the first direction Y1, wherein the plurality of active portions 6 may be distributed at intervals along the second direction X, and may be arranged corresponding to a plurality of pixel driving circuits one by one. As shown in FIG. 10, the active portion 6 may include the second active portion 62 and the fifth active portion 63 described above, wherein the second active portion 62 may form a channel region of the first transistor T1, and the fifth active portion 63 may form a channel region of the third transistor T3.

As shown in FIGS. 19 and 20, the second conductive layer may include the second conductive portion 55, the third conductive portion 721 and the sixth conductive portion 722 described above. The second conductive layer may further include a fourth gate line 74, a fifth gate line 75 and a sixth gate line 76. The fourth gate line 74, the fifth gate line 75 and the sixth gate line 76 may all extend along the second direction X. The fourth gate line 74 may be connected with the second gate line 12 through a via hole in the wiring area around the display area. The fifth gate line 75 may be connected with the third gate line 14 through a via hole in the wiring area around the display area. The fourth gate line 74 may include the second conductive portion 55 described above, and the second conductive portion 55 may be configured as a second gate electrode of the first transistor. The fifth gate line 75 may include a seventh gate portion 753, which may form a second gate electrode of the third transistor. The sixth gate line 76 may be configured as an initial signal line for providing an initial signal terminal Vinit shown in FIG. 1. The orthographic projection of the third conductive portion 721 on the base substrate may cover the orthographic projection of the first conductive portion 13 on the base substrate. The sixth conductive portion 722 may be connected with the power line in the third conductive layer through a via hole.

As shown in FIGS. 21 and 22, the third conductive layer may include the power line 26 and the fourth conductive portion 24 described above. In addition, the third conductive layer may also include a first conductive line 21, a seventh conductive portion 23, a first connecting portion 27, a second connecting portion 28, a third connecting portion 29 and a fourth connecting portion 201. The first connecting portion 27 may be connected with the fourth active portion 52 through a via hole 202 to connect a second electrode of the sixth transistor, and also connected with the sixth gate line 76 through a via hole 203, so that an initial signal terminal may be provided to the second electrode of the sixth transistor through the sixth gate line 76. In addition, the first connecting portion 27 may also be connected with the active portion 6 of the next row of the pixel driving circuit through a via hole 204, so as to provide an initial signal terminal to the third transistor of the next row of the pixel driving circuit through the sixth gate line 76. The second connecting portion 28 may be connected with the fourth active portion 52 through a via hole 205 so as to connect a second electrode of the fifth transistor. The third connecting portion 29 is connected to the active portion 6 through a via hole 206 so as to connect a second electrode of the first transistor, and the third connecting portion 29 may be connected to the fourth active portion 52 through a via hole 207 so as to connect a second electrode of the driving transistor, such that the second electrode of the first transistor is connected with the second electrode of the driving transistor. The fourth connecting portion 201 may be connected with the third active portion 51 through a via hole 208 so as to connect a first electrode of the second transistor.

As shown in FIGS. 23 and 24, the fourth conductive layer may include the fifth conductive portion 35 described above. In addition, the fourth conductive layer may also include a data line 31 and a fifth connecting portion 32. The data line 31 may be connected with the fourth connecting portion 201 through a via hole 33 to connect the first electrode of the second transistor T2. The fifth conductive portion 35 may be connected with the power line 26 through a via hole 34. The fifth connecting portion 32 may be connected with the second connecting portion 28 through a via hole 36 so as to connect with the second electrode of the fifth transistor. As shown in FIG. 24, a sectional view as shown in FIG. 5 may be cut along the dotted line A. It should be noted that a part of the structure is omitted in FIG. 5.

As shown in FIGS. 25 and 26, the anode layer may include a first anode portion 87, a second anode portion 88 and a third anode portion 83. The first anode portion 87 may be connected with the fifth connecting portion 32 through a via hole 84 so as to connect with the second electrode of the fifth transistor. The second anode portion 88 may be connected with the fifth connecting portion 32 in another pixel driving circuit through a via hole 85. The third anode portion 83 may be connected with the fifth connecting portion 32 in another pixel driving circuit through a via hole 86. The first anode portion 87 may be formed as a G light emitting unit; the second anode portion 88 may be formed as a R light emitting unit; and the third anode portion 83 may be formed as a B light emitting unit.

Figure 27:
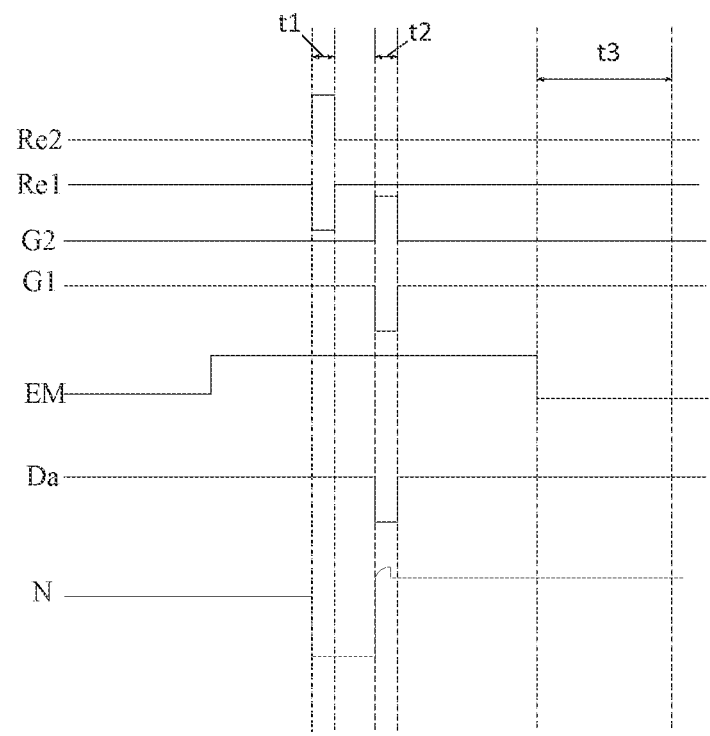
FIG. 27 is a timing diagram of nodes in a driving method of the pixel driving circuit of FIG. 1.

FIG. 27 is a timing diagram of nodes in a driving method of the pixel driving circuit of FIG. 1. In FIG. 27, "G1" represents a timing sequence of the first gate driving signal terminal G1, "G2" represents a timing sequence of the second gate driving signal terminal G2, "Re1" represents a timing sequence of the first reset signal terminal Re1, "Re2" represents a timing sequence of the second reset signal terminal Re2, "N" represents a timing sequence of the node N, "EM" represents a timing sequence of the enable signal terminal EM, and "Da" represents a timing sequence of the data signal terminal Da. The driving method of the pixel driving circuit may include a reset stage t1, a compensation stage t2, and a light emitting stage t3. In the reset stage t1, the first reset signal terminal Re1 outputs a low level signal, the second reset signal terminal Re2 outputs a high level signal, the third transistor T3 and the sixth transistor T6 are turned on, and the initial signal terminal Vinit inputs an initialization signal to the node N and the second electrode of the fifth transistor T5. In the compensation stage t2, the first gate driving signal terminal G1 outputs a low level signal, the second gate driving signal terminal G2 outputs a high level signal, the second transistor T2 and the first transistor T1 are turned on, and the data signal terminal Da outputs a driving signal to write a voltage Vdata+Vth to the node N, wherein Vdata is a voltage of the driving signal and Vth is a threshold voltage of the driving transistor DT. In the light emitting stage t3, the enable signal terminal EM outputs a low level signal, the fourth transistor T4 and the fifth transistor T5 are turned on, and the driving transistor DT emits light under the action of the voltage Vdata+Vth stored in the capacitor C. According to a driving transistor output current formula, $I=(\mu W Cox/2L)(Vgs-Vth)^2$, where $\mu$ is carrier mobility, Cox is a gate capacitance per unit area, W is a width of a driving transistor channel, L is a length of the driving transistor channel, Vgs is a gate-source voltage difference of the driving transistor, and Vth is a threshold voltage of the driving transistor. The output current of the driving transistor in the pixel driving circuit of the present disclosure is $I=(\mu W Cox/2L)(Vdata+Vth-Vdd-Vth)^2$. The pixel driving circuit can avoid the influence of a threshold of the driving transistor on its output current.

However, due to the parasitic capacitance between the gate electrode and the first electrode of the first transistor T1, as shown in FIG. 2, after the compensation stage t2 is completed, the second gate driving signal terminal G2 decreases from the high level to the low level, that is, the gate electrode of the first transistor T1 decreases from the high level to the low level, the voltage of the first electrode of the first transistor T1 decreases in case of the capacitive coupling effect, and the voltage of the node N connected with the first electrode of the first transistor T1 decreases also. According to the above driving transistor output current formula, decreasing the voltage of the node N (i.e., the gate electrode of the driving transistor) will affect the output current of the driving transistor. In order to ensure that the driving transistor outputs the driving current as normally required, the source driving circuit is required to provide a higher voltage data signal to the data signal terminal through the data line. By simulation, when the pixel driving circuit displays a gray scale of 0, the voltage provided by the source driving circuit to the data line is required to be greater than 6.3V, but the maximum voltage provided by the existing source driving circuit to the data line is 6V, which cannot meet the normal display requirements.

In the array substrate of this exemplary embodiment, as shown in FIG. 16, the second gate line 12 is arranged at a side of the first gate line 11 away from the first conductive portion 13. On the one hand, this arrangement increases a distance between the second gate line 12 and the first conductive portion 13, reduces a lateral capacitance between the second gate line 12 and the first conductive portion 13, and thus reduces a pull-down effect of the first transistor gate electrode on the driving transistor gate electrode after the compensation stage is completed. On the other hand, the first gate line 11 and the first conductive portion 13 may form a lateral capacitance, as shown in FIG. 2, the second transistor jumps from low level to high level after the compensation stage t2 is completed, so that the gate electrode of the second transistor may produce a pull up effect on the gate electrode of the driving transistor. The array substrate provided by this exemplary embodiment reduces a distance between the first gate line 11 and the first conductive portion 13, increases a lateral capacitance between the first gate line 11 and the first conductive portion 13, and thus enhances a pull-up effect of the gate electrode of the second transistor on the gate electrode of the driving transistor. Further, the first gate line 11 is located between the first conductive portion 13 and the second gate line 12, and the first gate line 11 may shield the second gate line 12 to a certain extent, thereby further reducing the pull-down effect of the first transistor gate electrode on the driving transistor gate electrode. In this exemplary embodiment, the pull-up effect of the first gate line 11 on the first conductive portion 13 is stronger than the pull-down effect of the second gate line 12 on the first conductive portion 13, so that the array substrate can offset the pull-down effect of the first transistor on the driving transistor gate electrode to a certain extent.

Figure 28:
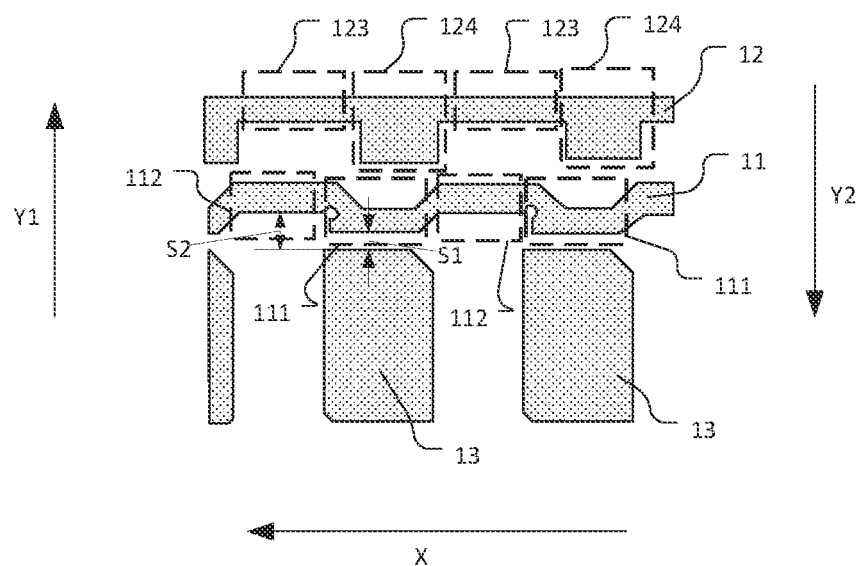
FIG. 28 is a partial layout structure of the first conductive layer in FIG. 9.

FIG. 28 is a partial layout structure of the first conductive layer in FIG. 9. The first gate line 11 may be located at a side of the first conductive portion 13 in a first direction Y1 and extend along a second direction X, wherein the first direction Y1 and the second direction X may intersect with each other, for example, the first direction Y1 may be perpendicular to the second direction X. The first gate line 11 may include a first extending portion 111 and a second extending portion 112. An orthographic projection of the first extending portion 111 on the base substrate aligns to an orthographic projection of at least part of the first conductive portion 13 on the base substrate in the first direction Y1. An orthographic projection of the second extending portion 112 on the base substrate misaligns to an orthographic projection of the first conductive portion 13 on the base substrate in the first direction Y1. Each of the first direction and the second direction may be a direction parallel to a plane where the base substrate is located. "An orthographic projection of the first extending portion 111 on the base substrate aligns to an orthographic projection of at least part of the first conductive portion 13 on the base substrate in the first direction Y1" can be understood as an area covered by infinitely moving the orthographic projection of the first extending portion 111 on the base substrate along the first direction Y1 and the third direction Y2 is completely overlapped with an area covered by infinitely moving the orthographic projection of at least the part of the first conductive portion 13 on the base substrate along the first direction Y1 and the third direction Y2, wherein the first direction Y1 is opposite to the third direction Y2. "An orthographic projection of the second extending portion 112 on the base substrate misaligns to an orthographic projection of the first conductive portion 13 on the base substrate in the first direction Y1" can be understood as an area covered by infinitely moving the orthographic projection of the second extending portion 112 on the base substrate along the first direction Y1 and the third direction Y2 does not intersect with an area covered by infinitely moving the orthographic projection of the first conductive portion 13 on the base substrate along the first direction Y1 and the third direction Y2.

In this exemplary embodiment, a distance S1 between the orthographic projection of the first extending portion 111 on the base substrate and the orthographic projection of the first conductive portion 13 on the base substrate in the third direction Y2 may be smaller than a distance S2 between the orthographic projection of the second extending portion 112 on the base substrate and the orthographic projection of the first conductive portion 13 on the base substrate in the third direction Y2. As shown in FIG. 28, the distance S1 between the orthographic projection of the first extending portion 111 on the base substrate and the orthographic projection of the first conductive portion 13 on the base substrate in the third direction Y2 may refer to a distance between an edge of the orthographic projection of the first extending portion 111 on the base substrate at a side facing to the first conductive portion 13 and an edge of the orthographic projection of the first conductive portion 13 on the base substrate at a side facing to the first extending portion 111 in the third direction Y2. The distance S2 between the orthographic projection of the second extending portion 112 on the base substrate and the orthographic projection of the first conductive portion 13 on the base substrate in the third direction Y2 may refer to a distance between an edge of the orthographic projection of the second extending portion 112 on the base substrate at a side facing to the first conductive portion 13 and an edge of the orthographic projection of the first conductive portion 13 on the base substrate at a side facing to the second extending portion 112 in the third direction Y2. This arrangement reduces the distance between the first extending portion 111 and the first conductive portion 13 in the third direction, and increases the lateral capacitance between the first extending portion 111 and the first conductive portion 13, thereby further increasing the pull-up effect of the first gate line on the gate electrode of the driving transistor.

In this exemplary embodiment, as shown in FIG. 28, a size of the orthographic projection of the first extending portion 111 on the base substrate in the second direction X may be equal to a size of the orthographic projection of the first conductive portion 13 on the base substrate in the second direction X. This arrangement can greatly increase the capacitance value of the lateral capacitance formed by the first extending portion 111 and the first conductive portion 13, so as to further increase the pull-up effect of the first gate line on the gate electrode of the driving transistor.

In this exemplary embodiment, at least part of the second extending portion 112 may be configured as the gate electrode of the first transistor. Since the distance between the orthographic projection of the second extending portion 112 on the base substrate and the orthographic projection of the first conductive portion 13 on the base substrate in the third direction Y2 is larger, a space for arranging the second transistor may be fully reserved in this design.

Figure 29:
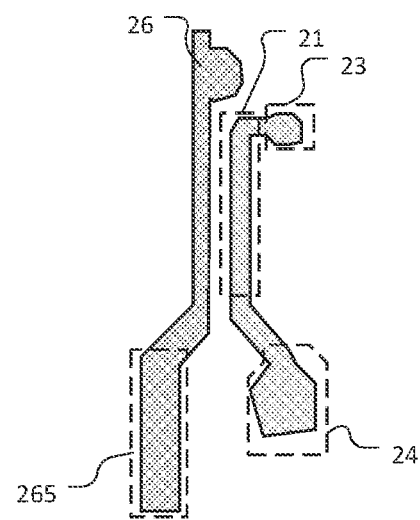
FIG. 29 is a partial layout structure of the third conductive layer in FIG. 21.
Figure 30:
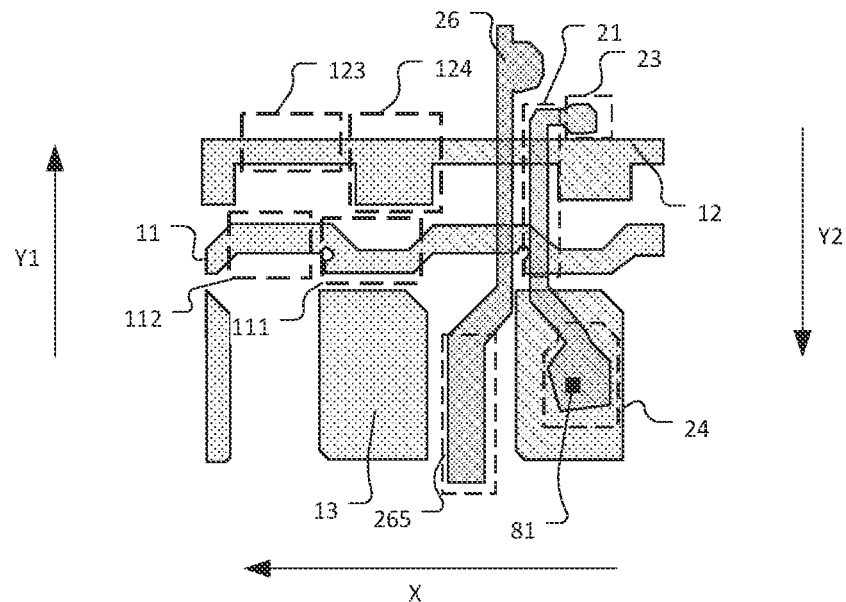
FIG. 30 is a partial layout structure in FIG. 22.

In this exemplary embodiment, as shown in FIGS. 29 and 30, FIG. 29 is a partial layout structure of the third conductive layer in FIG. 21, and FIG. 30 is a partial layout structure in FIG. 22. The third conductive layer may include the fourth conductive portion 24, the seventh conductive portion 23 and the first conductive line 21 described above. The fourth conductive portion 24 is electrically connected with the first conductive portion 13 through the first via hole 81. The seventh conductive portion 23 may be configured as the first electrode of the first transistor, and the orthographic projection of the first gate line 11 on the base substrate may be located between the orthographic projection of the fourth conductive portion 24 on the base substrate and the orthographic projection of the seventh conductive portion 23 on the base substrate. The first conductive line 21 is connected between the fourth conductive portion 24 and the seventh conductive portion 23, so that the first electrode of the first transistor is connected to the gate electrode of the driving transistor. The first conductive line 21 may extend along the first direction Y1, and has an orthographic projection on the base substrate that intersects with the orthographic projection of the first gate line 11 on the base substrate. Since the orthographic projection of the first conductive line 21 on the base substrate intersects with the orthographic projection of the first gate line 11 on the base substrate, a part of the first conductive line 21 and a part of the first gate line 11 may form a parallel plate capacitor structure. Using the coupling effect of the parallel plate capacitor structure, the first gate line 11 may pull up the first conductive line 21 after the compensation stage of the pixel driving circuit is completed, and since the first conductive line 21 is electrically connected with the first conductive portion 13, this arrangement can further enhance the pull-up effect of the first gate line 11 on the first conductive portion 13.

In this exemplary embodiment, as shown in FIGS. 28, 29 and 30, the orthographic projection of the second gate line 12 on the base substrate may be located between the orthographic projection of the first gate line 11 on the base substrate and the orthographic projection of the seventh conductive portion 23 on the base substrate. The second gate line 12 may include a third extending portion 123 and a fourth extending portion 124 which are alternately connected in sequence along the second direction X, wherein a size of the orthographic projection of the third extending portion 123 on the base substrate in the first direction Y1 may be smaller than a size of the orthographic projection of the fourth extending portion 124 on the base substrate in the first direction Y1. The orthographic projection of the first conductive line 21 on the base substrate may intersect with the orthographic projection of the third extending portion 123 on the base substrate. A part of the third extending portion 123 and a part of the first conductive line 21 may form a parallel plate capacitor structure. Based on the coupling effect of the parallel plate capacitor structure, the third extending portion 123 may pull down the first conductive line 21 after the compensation stage of the pixel driving circuit is completed, and since the first conductive line 21 is electrically connected with the first conductive portion 13, the third extending portion 123 can pull down the first conductive portion 13. In this exemplary embodiment, the size of the orthographic projection of the third extending portion 123 on the base substrate in the first direction Y1 is smaller than the size of the orthographic projection of the fourth extending portion 124 on the base substrate in the first direction Y1, that is, this exemplary embodiment reduces the size of the third extending portion 123 in the first direction Y1, thus reducing an electrode area of the parallel plate capacitor structure formed by the third extending portion 123 and the first conductive line 21. According to the capacitance calculation formula of the parallel plate capacitor, the capacitance of the parallel plate capacitor structure is proportional to its electrode area, and this arrangement reduces the capacitance of the parallel plate capacitor structure formed by the third extending portion 123 and the first conductive line 21, thus reducing the pull-down effect of the third extending portion 123 on the first conductive portion 13. A part of the fourth extending portion 124 may be configured as the first gate electrode of the first transistor. A channel region of the first transistor may extend along the first direction Y1, so that the channel region of the first transistor may have a larger length to reduce the leakage current of the first transistor.

In this exemplary embodiment, as shown in FIG. 30, the orthographic projection of the power line 26 on the base substrate may intersect with the orthographic projection of the third extending portion 123 on the base substrate. This arrangement can reduce the overlapping area between the power line 26 and the second gate line, thereby reducing the capacitive coupling effect of the power line 26 on the second gate line 12 when the voltage fluctuates.

Figure 31:
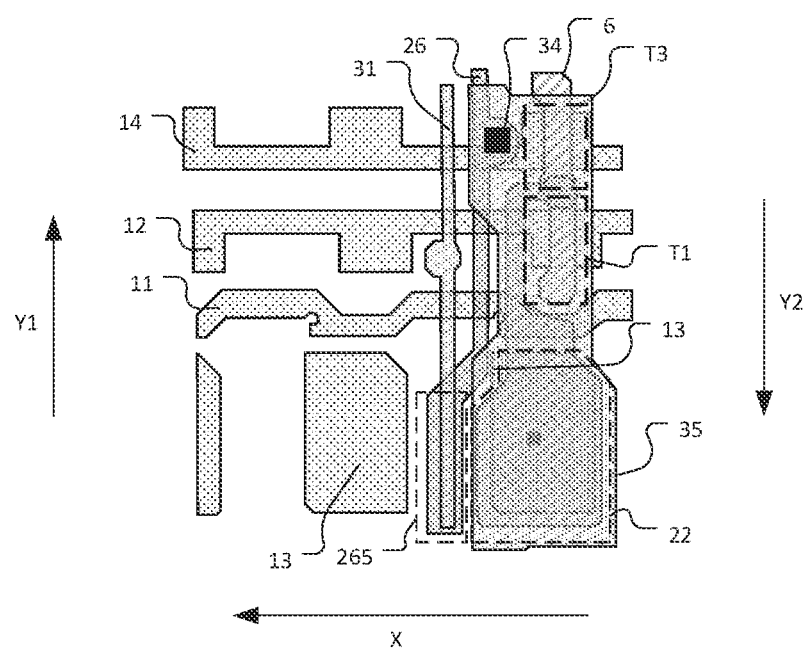
FIG. 31 is a partial layout structure in FIG. 24.

As shown in FIGS. 30 and 31, FIG. 31 is a partial layout structure in FIG. 24. The power line 26 may include a fifth extending portion 265, and the orthographic projection of the fifth extending portion 265 on the base substrate is opposite to the orthographic projection of at least part of the first conductive portion 13 on the base substrate in the second direction X. "The orthographic projection of the fifth extending portion 265 on the base substrate is opposite to the orthographic projection of at least part of the first conductive portion 13 on the base substrate in the second direction X" can be understood as that, an area covered by infinitely moving the orthographic projection of the fifth extending portion 265 on the base substrate along the second direction and in a direction opposite to the second direction is fully overlapped with an area covered by infinitely moving the orthographic projection of at least part of the first conductive portion 13 along the second direction and in the direction opposite to the second direction. The orthographic projection of a part of the data line 31 on the base substrate may be located on the orthographic projection of the fifth extending portion 265 on the base substrate. The fifth extending portion 265 is laminated between the data line 31 and the first conductive portion 13, and receives a stable voltage, so that the fifth extending portion 265 may serve as a shielding layer to reduce the coupling capacitance between the data line 31 and the first conductive portion 13, thereby reducing the coupling effect of the data line 31 on the first conductive portion 13. The fifth conductive portion 35 may be connected with the power line 26 through a via hole 34.

In this exemplary embodiment, when a width-length ratio of the channel region of the driving transistor in the R pixel unit, a width-length ratio of the channel region of the driving transistor in the G pixel unit, and a width-length ratio of the channel region of the driving transistor in the B pixel unit are same, the R pixel unit, G pixel unit and B pixel unit have different driving voltage intervals (i.e., a difference between a data signal voltage at the maximum brightness and a data signal voltage at the lowest brightness). The source driving circuit is required to provide data signals with different driving voltage intervals to the R pixel unit, the G pixel unit and the B pixel unit, and the source driving circuit is required to switch between different driving voltage intervals, therefore the source driving circuit is required to consume more power. In this exemplary embodiment, a width-length ratio of a channel region of the driving transistor in the R pixel driving circuit, a width-length ratio of a channel region of the driving transistor in the G pixel driving circuit and a width-length ratio of a channel region of the driving transistor in the G pixel driving circuit may be not all the same. That is, in the R pixel driving circuit, the G pixel driving circuit and the B pixel driving circuit, the width-length ratio of the channel region of the driving transistor in at least one of the pixel driving circuits is not equal to the width-length ratio of the channel region of the driving transistor in other pixel driving circuits. For example, the width-length ratio of the channel region of the driving transistor in the R pixel driving circuit may be 3.5/40, and the width-length ratio of the channel region of the driving transistor in the B pixel driving circuit can be 3.5/25. Specifically, as shown in FIG. 15, the channel region of the driving transistor in the B pixel unit is Z-type, and the channel region of the driving transistor in the R pixel unit and the channel region of the driving transistor in the G pixel unit are S-type. According to the simulation, it can be seen that compared with the case in which the channel region of the driving transistor in the R pixel driving circuit, the channel region of the driving transistor in the G pixel driving circuit and the channel region of the driving transistor in the B pixel driving circuit have the same width-length ratio, this arrangement can reduce the difference of the driving voltages among the R pixel unit, the G pixel unit and the B pixel unit, thus reducing the power consumption of the source driving circuit.

This exemplary embodiment also provides a display device, wherein the display device may include the array substrate described above. The display device may be a display device such as a mobile phone, a tablet computer, a television, or the like.

Other embodiments of the invention will be apparent to those skilled in the art from consideration of the specification and practice of the invention disclosed here. This application is intended to cover any variations, uses, or adaptations of the invention following the general principles thereof and including such departures from the present disclosure as come within known or customary practice in the art. It is intended that the specification and examples be considered as exemplary only, with a true scope and spirit of the invention being indicated by the following claims.

It will be appreciated that the present invention is not limited to the exact construction that has been described above and illustrated in the accompanying drawings, and that various modifications and changes can be made without departing from the scope thereof. It is intended that the scope of the invention only be limited by the appended claims.

What is claimed is:
1. An array substrate, comprising:
 a pixel driving circuit, the pixel driving circuit comprising a P-type driving transistor, an N-type first transistor, and a capacitor, wherein a first electrode of the N-type first transistor is connected to a gate electrode of the

P-type driving transistor, and a first electrode of the capacitor is connected to the gate electrode of the P-type driving transistor;
a base substrate;
a first conductive layer laminated at a side of the base substrate, the first conductive layer comprising a first conductive portion, and the first conductive portion being configured as the gate electrode of the P-type driving transistor and the first electrode of the capacitor;
a first dielectric layer laminated at a side of the first conductive layer facing away from the base substrate;
a first buffer layer laminated at a side of the first dielectric layer facing away from the base substrate, a slot being provided on the first buffer layer, and an orthographic projection of the slot on the base substrate being at least partially overlapped with an orthographic projection of the first conductive portion on the base substrate; and
a second conductive layer laminated at a side of the first buffer layer facing away from the base substrate, the second conductive layer comprising:
a second conductive portion configured as a gate electrode of the N-type first transistor; and
a third conductive portion at least partially at a bottom portion of the slot, an orthographic projection of the third conductive portion on the base substrate being at least partially overlapped with the orthographic projection of the first conductive portion on the base substrate, so as to form a second electrode of the capacitor.

2. The array substrate according to claim 1, wherein the slot extends to a surface of the first dielectric layer, and the third conductive portion is at a side of the first dielectric layer facing away from the base substrate.

3. The array substrate according to claim 1, wherein:
the array substrate further comprises: a third conductive layer laminated at a side of the second conductive layer facing away from the base substrate, and including a fourth conductive portion electrically connected with the first conductive portion through a first via hole penetrating through the third conductive portion; and
an orthographic projection of the fourth conductive portion on the base substrate is on the orthographic projection of the first conductive portion on the base substrate, and an area of the orthographic projection of the fourth conductive portion on the base substrate is smaller than that of the orthographic projection of the first conductive portion on the base substrate.

4. The array substrate according to claim 3, wherein a ratio of the area of the orthographic projection of the fourth conductive portion on the base substrate to an area of an orthographic projection of the first via hole on the base substrate is 1-1.5.

5. The array substrate according to claim 3, wherein a ratio of the area of the orthographic projection of the fourth conductive portion on the base substrate to an area of the orthographic projection of the first conductive portion on the base substrate is 8%-15%.

6. The array substrate according to claim 3, wherein:
a second via hole is formed on the third conductive portion and extends through the first dielectric layer to a surface of the first conductive portion; and
the array substrate further comprises a second dielectric layer laminated between the second conductive layer and the third conductive layer and filling the second via hole, wherein the first via hole is formed on the second dielectric layer and extends through the third conductive portion to the surface of the first conductive portion, and an orthographic projection of the first via hole on the base substrate is within an orthographic projection of the second via hole on the base substrate.

7. The array substrate according to claim 3, wherein:
the third conductive layer further comprises a power line for providing a power supply voltage; and
the array substrate further comprises: a fourth conductive layer laminated at a side of the third conductive layer facing away from the base substrate, and comprising a fifth conductive portion connected with the power line, an orthographic projection of the fifth conductive portion on the base substrate covering the orthographic projection of the first conductive portion on the base substrate.

8. The array substrate according to claim 7, wherein the second conductive layer further comprises a sixth conductive portion connected with the third conductive portion, and the sixth conductive portion is connected with the power line through a via hole.

9. The array substrate according to claim 3, wherein the array substrate further comprises:
a barrier layer laminated at a side of the base substrate;
a second buffer layer laminated at a side of the barrier layer facing away from the base substrate;
a first active layer laminated at a side of the second buffer layer facing away from the base substrate, the first active layer comprising a first active portion, the first active portion being configured as a channel region of the P-type driving transistor;
a second gate insulating layer laminated at a side of the first active layer facing away from the base substrate, the first conductive layer being laminated at a side of the second gate insulating layer facing away from the base substrate;
a second active layer laminated at a side of the first buffer layer facing away from the base substrate and comprising a second active portion, the second active portion being configured as a channel region of the N-type first transistor;
a first gate insulating layer laminated at a side of the second active layer facing away from the base substrate, the second conductive layer being laminated at a side of the first gate insulating layer facing away from the base substrate;
a second dielectric layer laminated at a side of the second conductive layer facing away from the base substrate, the third conductive layer being laminated at a side of the second dielectric layer facing away from the base substrate; and
a passivation layer laminated at a side of the third conductive layer facing away from the base substrate.

10. The array substrate according to claim 9, wherein:
the array substrate comprises a non-display area, and a strip-shaped groove is formed in the non-display area on the array substrate, and extends through the passivation layer, the second dielectric layer, the first buffer layer, the first dielectric layer, the second gate insulating layer, the second buffer layer, and the barrier layer to a surface of the base substrate;
the array substrate further comprises: a first flat layer laminated at a side of the passivation layer facing away from the base substrate and filling the strip-shaped groove; and
a bendable performance of a material of the first flat layer is stronger than that of a material of any of the passivation layer, the second dielectric layer, the first buffer layer, the first dielectric layer, the second buffer layer, and the barrier layer.

11. The array substrate according to claim 1, wherein a thickness of the first dielectric layer in a laminated direction is 1,200-1,400 angstroms.

12. The array substrate according to claim 1, further comprising
an enable signal line, an initial signal line, an anode layer, a first reset signal line, a second reset signal line, a power line, a first gate line, a second gate line and a data line, wherein the N-type first transistor has a second electrode connected to a second electrode of the P-type driving transistor and a gate electrode connected to the second gate line, and wherein the pixel driving circuit further comprises:
a second transistor having a first electrode connected to the data line, a second electrode connected to the first electrode of the P-type driving transistor, and a gate electrode connected to the first gate line;
a third transistor having a first electrode connected to the gate electrode of the P-type driving transistor, a second electrode connected to the initial signal line, and a gate electrode connected to the second reset signal line;
a fourth transistor having a first electrode connected to the power line, a second electrode connected to the first electrode of the P-type driving transistor, and a gate electrode connected to the enable signal line;
a fifth transistor having a first electrode connected to the second electrode of the P-type driving transistor, a second electrode connected to the anode layer, and a gate electrode connected to the enable signal line; and
a sixth transistor having a first electrode connected to the second electrode of the fifth transistor, a second electrode connected to the initial signal line, and a gate electrode connected to the first reset signal line.

13. The array substrate according to claim 12, wherein the P-type driving transistor, the second transistor, the fourth transistor, the fifth transistor, and the sixth transistor are P-type low-temperature polysilicon transistors.

14. The array substrate according to claim 12, wherein the N-type first transistor and the third transistor are N-type metal oxide transistors.

15. A fabrication method of an array substrate, comprising:
providing the array substrate, the array substrate comprising a pixel driving circuit comprising a P-type driving transistor, an N-type first transistor, and a capacitor, wherein a first electrode of the N-type first transistor is connected with a gate electrode of the P-type driving transistor, and a first electrode of the capacitor is connected with the gate electrode of the P-type driving transistor;
forming a base substrate;
forming a first conductive layer at a side of the base substrate, the first conductive layer comprising a first conductive portion, and the first conductive portion being configured as the gate electrode of the P-type driving transistor and the first electrode of the capacitor;
forming a first dielectric layer at a side of the first conductive layer facing away from the base substrate;
forming a first buffer layer at a side of the first dielectric layer facing away from the base substrate, a slot being provided on the first buffer layer, an orthographic projection of the slot on the base substrate being at least partially overlapped with an orthographic projection of the first conductive portion on the base substrate; and forming a second conductive layer at a side of the first buffer layer facing away from the first conductive layer, wherein the second conductive layer comprises:
a second conductive portion configured as a gate electrode of the N-type first transistor; and
a third conductive portion at a bottom portion of the slot, an orthographic projection of the third conductive portion on the base substrate being at least partially overlapped with the orthographic projection of the first conductive portion on the base substrate so as to form a second electrode of the capacitor.

16. The fabrication method of the array substrate according to claim 15, wherein forming the first buffer layer at the side of the first dielectric layer facing away from the first conductive layer comprises:
forming a first buffer material layer at a side of the first dielectric layer facing away from the base substrate;
forming a first gate insulating material layer at a side of the first buffer material layer facing away from the base substrate; and
etching the first buffer material layer and the first gate insulating material layer to form the slot.

17. The fabrication method of the array substrate according to claim 15, further comprising:
forming a third conductive layer at a side of the second conductive layer facing away from the base substrate, the third conductive layer comprising a fourth conductive portion electrically connected with the first conductive portion through a via hole penetrating through the third conductive portion;
wherein an orthographic projection of the fourth conductive portion on the base substrate is on the orthographic projection of the first conductive portion on the base substrate, and an area of the orthographic projection of the fourth conductive portion on the base substrate is smaller than that of the orthographic projection of the first conductive portion on the base substrate.

18. The fabrication method of the array substrate according to claim 17, wherein, before forming the third conductive layer at the side of the second conductive layer facing away from the base substrate, the fabrication method further comprises:
forming a second via hole on the third conductive portion, wherein the second via hole extends through the first dielectric layer to a surface of the first conductive portion;
forming a second dielectric layer at a side of the second conductive layer facing away from the base substrate, the second dielectric layer filling the second via hole; and
forming a first via hole on the second dielectric layer, the first via hole extending through the third conductive portion to the surface of the first conductive portion, and an orthographic projection of the first via hole on the base substrate being within an orthographic projection of the second via hole on the base substrate, wherein the fourth conductive portion fills the first via hole.

19. A display device comprising an array substrate, the array substrate comprising:
a pixel driving circuit, the pixel driving circuit comprising a P-type driving transistor, an N-type first transistor, and a capacitor, wherein a first electrode of the N-type first transistor is connected to a gate electrode of the P-type driving transistor, and a first electrode of the capacitor is connected to the gate electrode of the P-type driving transistor;

a base substrate;

a first conductive layer laminated at a side of the base substrate, the first conductive layer comprising a first conductive portion, and the first conductive portion being configured as the gate electrode of the P-type driving transistor and the first electrode of the capacitor;

a first dielectric layer laminated at a side of the first conductive layer facing away from the base substrate;

a first buffer layer laminated at a side of the first dielectric layer facing away from the base substrate, a slot being provided on the first buffer layer, and an orthographic projection of the slot on the base substrate being at least partially overlapped with an orthographic projection of the first conductive portion on the base substrate; and a second conductive layer laminated at a side of the first buffer layer facing away from the base substrate, the second conductive layer comprising:

a second conductive portion configured as a gate electrode of the N-type first transistor; and a third conductive portion at least partially at a bottom portion of the slot, an orthographic projection of the third conductive portion on the base substrate being at least partially overlapped with the orthographic projection of the first conductive portion on the base substrate, so as to form a second electrode of the capacitor.

* * * * *